(12) United States Patent
Vuillermet et al.

(10) Patent No.: US 12,078,662 B2
(45) Date of Patent: Sep. 3, 2024

(54) TECHNIQUES FOR REDUCING AN EDDY CURRENT IN A GROUND PLANE OF A CORELESS SENSOR

(71) Applicant: Allegro MicroSystems, LLC, Manchester, NH (US)

(72) Inventors: Yannick Vuillermet, Voglans (FR); Loïc André Messier, Vanzy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 156 days.

(21) Appl. No.: 17/850,152

(22) Filed: Jun. 27, 2022

(65) Prior Publication Data
US 2023/0417802 A1  Dec. 28, 2023

(51) Int. Cl.
*G01R 15/20* (2006.01)
*G01R 19/00* (2006.01)
*H05K 1/02* (2006.01)
*H05K 1/18* (2006.01)

(52) U.S. Cl.
CPC ....... *G01R 15/202* (2013.01); *G01R 19/0092* (2013.01); *H05K 1/0225* (2013.01); *H05K 1/18* (2013.01); *H05K 2201/09854* (2013.01); *H05K 2201/10151* (2013.01); *H05K 2201/10689* (2013.01)

(58) Field of Classification Search
CPC .............. G01R 15/202; G01R 19/0092; H05K 1/0225; H05K 1/18; H05K 2201/09854; H05K 2201/10151; H05K 2201/10689
See application file for complete search history.

(56) References Cited

U.S. PATENT DOCUMENTS

| | | | |
|---|---|---|---|
| 5,041,780 A | 8/1991 | Rippel | |
| 5,781,074 A * | 7/1998 | Nguyen | H03B 1/04 331/158 |
| 7,598,601 B2 | 10/2009 | Taylor et al. | |
| 7,816,905 B2 * | 10/2010 | Doogue | G01R 15/207 324/117 H |

(Continued)

FOREIGN PATENT DOCUMENTS

| | | |
|---|---|---|
| CN | 112649645 A | 4/2021 |
| EP | 3327449 A1 * | 5/2018 |

OTHER PUBLICATIONS

U.S. Appl. No. 17/804,654, filed May 31, 2022, Messier et al.

*Primary Examiner* — Vinh P Nguyen
(74) *Attorney, Agent, or Firm* — Daly, Crowley, Mofford & Durkee, LLP

(57) ABSTRACT

A current sensor system includes a current sensor integrated circuit (IC) and a printed circuit board (PCB) having a ground plane with a feature configured to reduce an eddy current. The current sensor IC includes a lead frame comprising a die attach pad and at least one lead, a semiconductor die having a first surface attached to the die attach pad and a second, opposing surface, at least one magnetic field sensing element supported by the semiconductor die and configured to sense a current in a proximate primary conductor, and a non-conductive mold material enclosing the semiconductor die and a portion of the at least one lead. The PCB ground plane feature can take various forms such as a hole of a dimension larger than the current sensor IC, elongated cuts, or x-shaped cuts.

26 Claims, 18 Drawing Sheets

(56) References Cited

U.S. PATENT DOCUMENTS

| | | | |
|---|---|---|---|
| 7,923,996 B2* | 4/2011 | Doogue | G01R 33/0041 |
| | | | 324/252 |
| 8,080,994 B2 | 12/2011 | Taylor et al. | |
| 8,847,590 B2 | 9/2014 | Flock et al. | |
| 9,299,915 B2 | 3/2016 | Milano et al. | |
| 9,620,705 B2 | 4/2017 | Milano et al. | |
| 10,333,055 B2 | 6/2019 | Milano et al. | |
| 10,352,969 B2 | 7/2019 | Milano et al. | |
| 10,481,181 B2* | 11/2019 | Bussing | G01R 15/207 |
| 11,262,385 B2 | 3/2022 | Milano et al. | |
| 11,320,466 B1* | 5/2022 | Briano | G01R 19/15 |
| 2005/0016746 A1* | 1/2005 | Sze | H05K 1/0227 |
| | | | 174/376 |
| 2011/0133732 A1 | 6/2011 | Sauber | |
| 2022/0137097 A1 | 5/2022 | Milano et al. | |

* cited by examiner

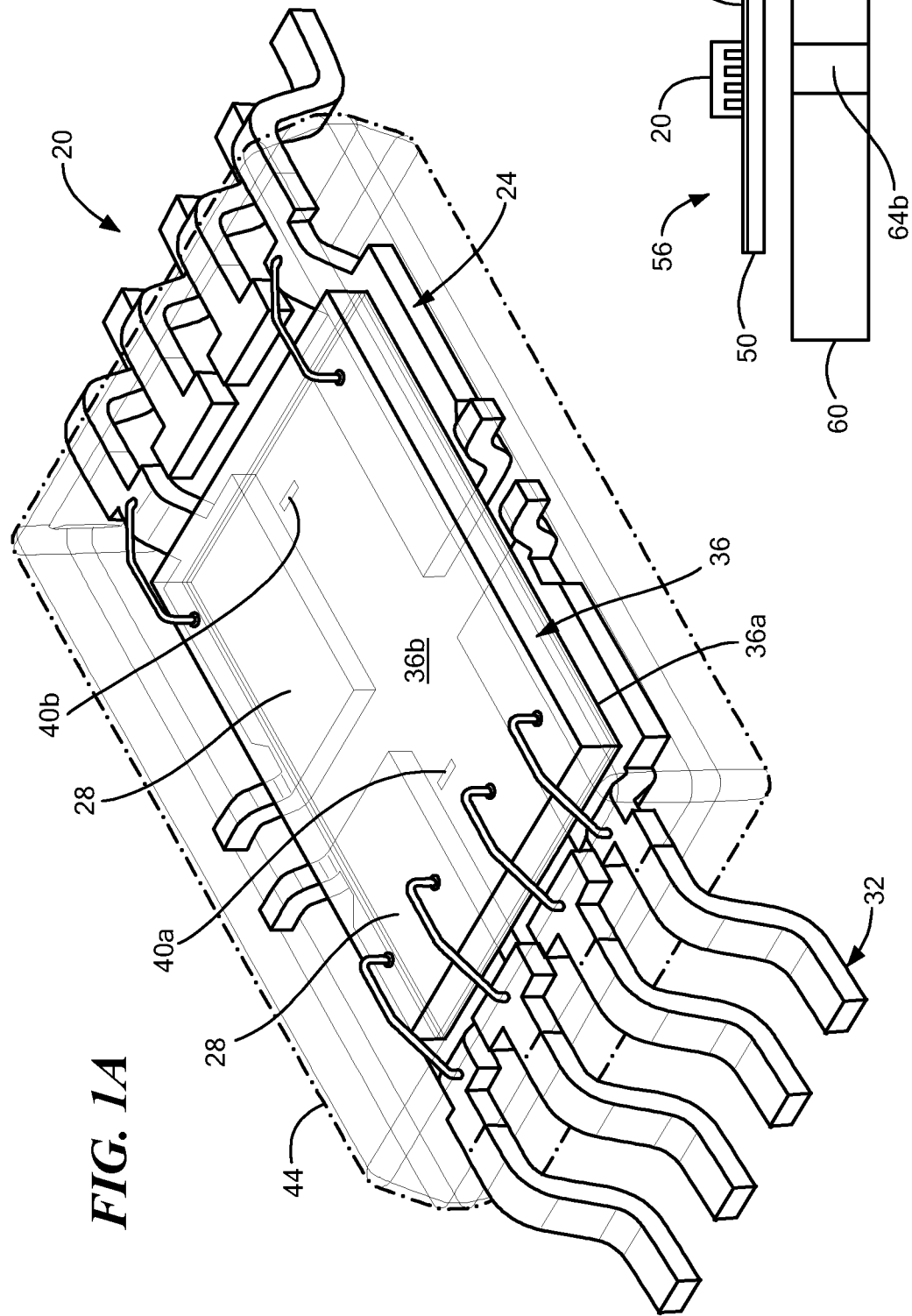

TECHNIQUES FOR REDUCING AN EDDY CURRENT IN A GROUND PLANE OF A CORELESS SENSOR

CROSS REFERENCE TO RELATED APPLICATIONS

Not Applicable.

STATEMENT REGARDING FEDERALLY SPONSORED RESEARCH

Not Applicable.

FIELD

The present disclosure relates generally to coreless current sensor applications and more particularly to printed circuit board ground plane optimization for coreless current sensor applications.

BACKGROUND

Some conventional electrical current sensors include one or more magnetic field sensing elements positioned near a current-carrying conductor to sense a magnetic field generated by the current through the conductor. The current sensor generates an output signal having a magnitude proportional to the magnetic field induced by the current through the conductor.

A soft ferromagnetic material or other magnetic core is sometimes positioned around the conductor in order to concentrate the magnetic field in the vicinity of the sensor. Such a core may increase the magnitude of the magnetic field in the vicinity of the sensing elements and provide some shielding against stray magnetic fields, such as those that may be caused by current flowing in adjacent conductors. If no core is used, the sensor may be referred to as a "coreless" current sensor.

Current sensors are often provided in the form of an integrated circuit (IC) that is electrically coupled to a substrate such, as a printed circuit board (PCB). In a PCB, a conductive layer or a portion of a conductive layer is usually used as a ground plane. The ground plane is useful to connect components to a reference or ground potential, in order to reduce return current impedance and to protect against electromagnetic interference.

In current sensor applications, eddy currents can be induced in the PCB ground plane by the current flow in the conductor. Such eddy currents can generate a parasitic magnetic field that can be sensed by the current sensor. Accurately measuring the intended, or primary current through the conductor (that can be referred to as the primary conductor) can be challenging in systems susceptible to such parasitic magnetic fields, since such parasitic magnetic fields introduce error into the current measurement and/or delay in the current measurement.

SUMMARY

Described herein are coreless current sensor systems with printed circuit board ground plane features and designs that reduce or eliminate eddy currents in the printed circuit board ground plane. With the described arrangements, current sensor accuracy and response time is improved.

According to the disclosure, a current sensor includes a current sensor integrated circuit (IC) and a printed circuit board (PCB) having a ground plane with a feature configured to reduce an eddy current. The current sensor IC can include a lead frame having a die attach pad and at least one lead, a semiconductor die having a first surface attached to the die attach pad and a second, opposing surface, at least one magnetic field sensing element supported by the semiconductor die and configured to sense a current in a proximate primary conductor, and a non-conductive mold material enclosing the semiconductor die and a portion of the at least one lead.

Features may include one or more of the following alone or in combination. The ground plane feature can be substantially vertically aligned with the at least one magnetic field sensing element. The ground plane feature can include a hole in the ground plane. The hole can have a dimension larger than a dimension of the non-conductive mold material. The ground plane feature can include a plurality of elongated cuts. Each of the plurality of elongated cuts can extend in a single direction. The single direction can be substantially parallel to the at least one lead or diagonal with respect to the at least one lead. The elongated cuts can include a first plurality of elongated cuts extending in a first direction and a second plurality of elongated cuts extending in a second direction that is substantially orthogonal with respect to the first direction.

Each of the plurality of elongated cuts can include a continuous cut. The plurality of elongated cuts can form a portion of the ground plane that is not electrically coupled to ground. At least one of the elongated cuts can be discontinuous. The ground plane feature can include a plurality of substantially x-shaped cuts. The primary conductor can include at least one notch proximate to the magnetic field sensing element. The magnetic field sensing element can include at least two magnetic field sensing elements, each configured to generate a respective magnetic field signal indicative of a magnetic field, wherein the semiconductor die further supports a circuit responsive to the magnetic field signals from the at least two magnetic field sensing elements and configured to generate a current sensor output signal based on a difference between the magnetic field signals from the at least two magnetic field sensing elements and indicative of the current through the primary conductor. The PCB can have a first layer including the ground plane and a second layer including a conductive trace to which the at least one lead is coupled. The first surface of the semiconductor die can support the at least one magnetic field sensing element in a "die up" configuration or the second surface of the semiconductor die can support the at least one magnetic field sensing element in a "flip-chip" configuration. The at least one lead can include a lead coupled to the ground plane.

Also described is a method of sensing a current in a primary conductor including providing a PCB with a ground plane having a feature configured to reduce an eddy current, providing a current sensor IC, and mounting the current sensor IC on the PCB. Providing the current sensor IC can include providing the IC with a lead frame having a die attach pad and at least one lead, a semiconductor die having a first surface attached to the die attach pad and a second, opposing surface, at least one magnetic field sensing element, and a non-conductive mold material enclosing the semiconductor die and a portion of the at least one lead.

Features may include one or more of the following alone or in combination. Providing the PCB can include providing the feature of the ground plane in substantial vertical alignment with the at least one magnetic field sensing element. Providing the PCB can include providing the feature of the ground plane in the form of a hole having a dimension larger than a dimension of the non-conductive mold material, a plurality of elongated cuts, or a plurality of substantially x-shaped cuts.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 1A is a transparent view of a current sensor IC of the system of FIG. 1;

FIG. 1B is a side view of the current sensor system of FIG. 1;

DETAILED DESCRIPTION

Figure 1:
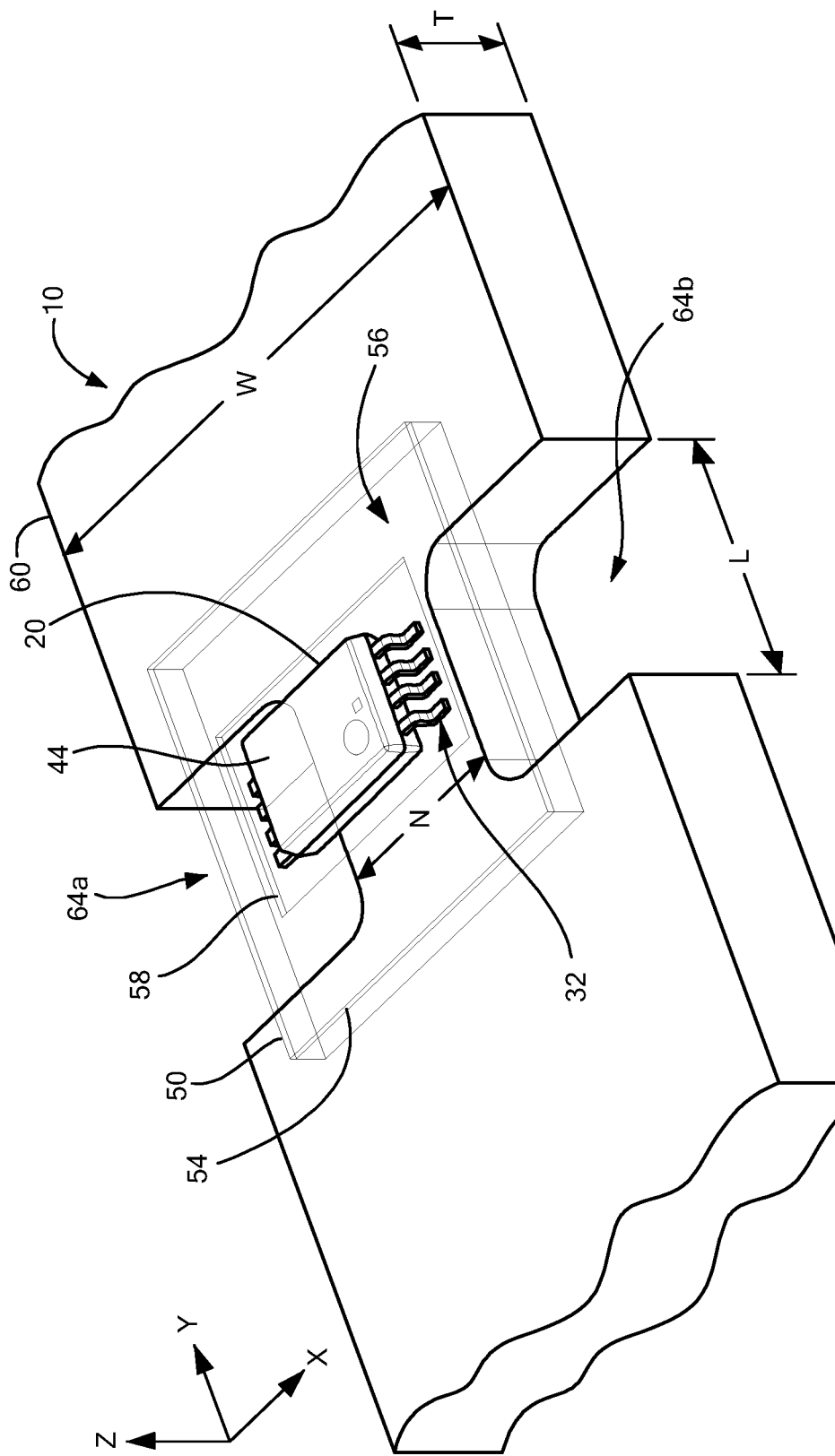
FIG. 1 is a perspective view of a coreless current sensor system including a PCB having a ground plane eddy current reduction feature according to the disclosure.

Referring to FIGS. 1 and 1A, a current sensor system 10 includes a current sensor integrated circuit (IC) 20 and a printed circuit board (PCB) 50 having a ground plane 54 with a feature 58 configured to reduce an eddy current. As is visible in FIG. 1A, the current sensor IC 20 can include a lead frame 24 having a die attach pad 28 and at least one lead 32 (referred to herein as leads 32), a semiconductor die 36 having a first surface 36a attached to the die attach pad and a second, opposing surface 36b, at least one magnetic field sensing element (and here two sensing elements 40a, 40b) supported by the semiconductor die and configured to sense a current in a proximate primary conductor 60, and a non-conductive mold material 44 enclosing the semiconductor die 36 and a portion of at least one lead 32.

The current sensor IC 20 is mounted to the PCB 50 to form an IC and PCB subassembly 56. The IC 20 is configured to sense a primary current flowing in the proximate, primary conductor 60 by sensing the magnetic field generated by the current. An output signal of the current sensor IC 20 is indicative of the primary current and along with other circuitry supported by the semiconductor die 36 can be coupled to external circuits and/or systems by one of more leads 32. Wire bonds can electrically couple components and circuitry supported by the semiconductor die 36 to the leads 32, as shown in FIG. 1A. It will be appreciated by those of ordinary skill in the art that bond pads (i.e., plated areas) can be provided on the semiconductor die 36 and on the leads 32 to facilitate wire bond attachment, such as by soldering.

Eddy currents can be induced in the PCB ground plane 54 as a result of the magnetic field generated by the primary current through the primary conductor 60. Described herein are features of the ground plane 54 designed to reduce or eliminate such eddy currents in order to thereby improve the accuracy and response time of sensing the primary current in the conductor 60. The eddy current reduction ground plane features can take various forms. Suffice it to say here that embodiments include a hole 58 in the ground plane 54 and/or cuts or cutouts of various configurations (e.g., elongated cuts or cuts of various designs) in the ground plane.

The primary conductor 60 can take various forms, such as a bus bar, and can be comprised of various conductive materials, such as copper, depending on the current sensing application and requirements. The example conductor 60 has a width "W" and a thickness "T". The conductor 60 can have one or more notches, and here two notches 64a, 64b, sized, shaped and positioned to concentrate the current flow and therefore also the resulting magnetic field in the vicinity of the current sensor IC 20 in order to thereby locally increase the current density and the signal measured by the IC. In the example conductor 60, each of complementary notches 64a, 64b has a length "L" and together, the notches establish a narrowed conductor portion proximate to the current sensor IC 20 with a resulting narrowed width "N" as shown.

It will be appreciated by those of ordinary skill in the art however, that the present disclosure is not limited to any particular conductor design or features or characteristics. For example, in some applications, the conductor can take the form of a second PCB having conductive traces configured to carry the primary current. Example applications for the current sensor system 10 include electric vehicle applications (all-electric, hybrid or plug-in), such as inverters, charging stations, on-board chargers, or DC-links. Typical current levels for the primary current can be from 200 A to more than 2000 A.

The current sensor IC 20 can take various forms. For example, the IC 20 can include at least two sensing elements 40a, 40b to permit differential sensing as can be advantageous to reject common mode stray magnetic fields. Further, the sensing elements 40a, 40b can be various types of magnetic field sensing elements, such as Hall effect elements. An example sensor IC is shown and described in further detail below in connection with FIG. 15.

More generally, as used herein, the term "magnetic field sensing element" is used to describe a variety of electronic elements that can sense a magnetic field. The magnetic field sensing element can be, but is not limited to, a Hall-effect element, fluxgate element, magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. For example, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

The PCB 50 can have a single conductive layer or multiple conductive layers. In the case of a single conductive layer, such layer is encapsulated by dielectric insulating material, in which case the single conductive layer includes both the ground plane and conductive signal traces with which one or more signals are carried between the current sensor IC 20 and external circuits and/or systems. Alternatively, the PCB 50 can have multiple conductive layers separated by dielectric material layers, in which case the ground plane 54 may or may not be on the same conductive layer as conductive signal traces. Generally, the conductive layers and signal traces are copper with a typical thickness on the order 35 μm.

The PCB ground plane 54 can be on any layer of a multi-layer PCB or can be on the single layer of a single conductive layer PCB. In the illustrated embodiments, the ground plane 54 is shown to be the "top" layer of the PCB, closest to the current sensor IC 20.

The current sensor IC 20 can be mounted to the PCB 50 by various mechanisms. For example, terminal ends of the IC leads 32 can be formed for surface mount attachment to the PCB 50, as shown. Alternatively, terminal ends of the IC leads 32 can be straight pins configured for through-hole attachment to the PCB 50.

The magnetic field sensing elements 40a, 40b can be supported by the second surface 36b of semiconductor die 36, as can be referred to as a "die up" configuration, as shown. Alternatively, the magnetic field sensing elements 40a, 40b can be supported by the first surface 36a of the die that is attached to the die attach pad 28 of the lead frame 24 in a so-called "flip-chip" configuration. As another alternative, the semiconductor die can be attached to the lead frame under the leads in a so-called "lead-on-chip" configuration.

As can be seen from the side view of the sensor system 10 of FIG. 1B, the IC and PCB subassembly 56 can be positioned with respect to the primary conductor 60 such that the PCB 50 is between the IC 20 and the conductor 60.

Figure 2:
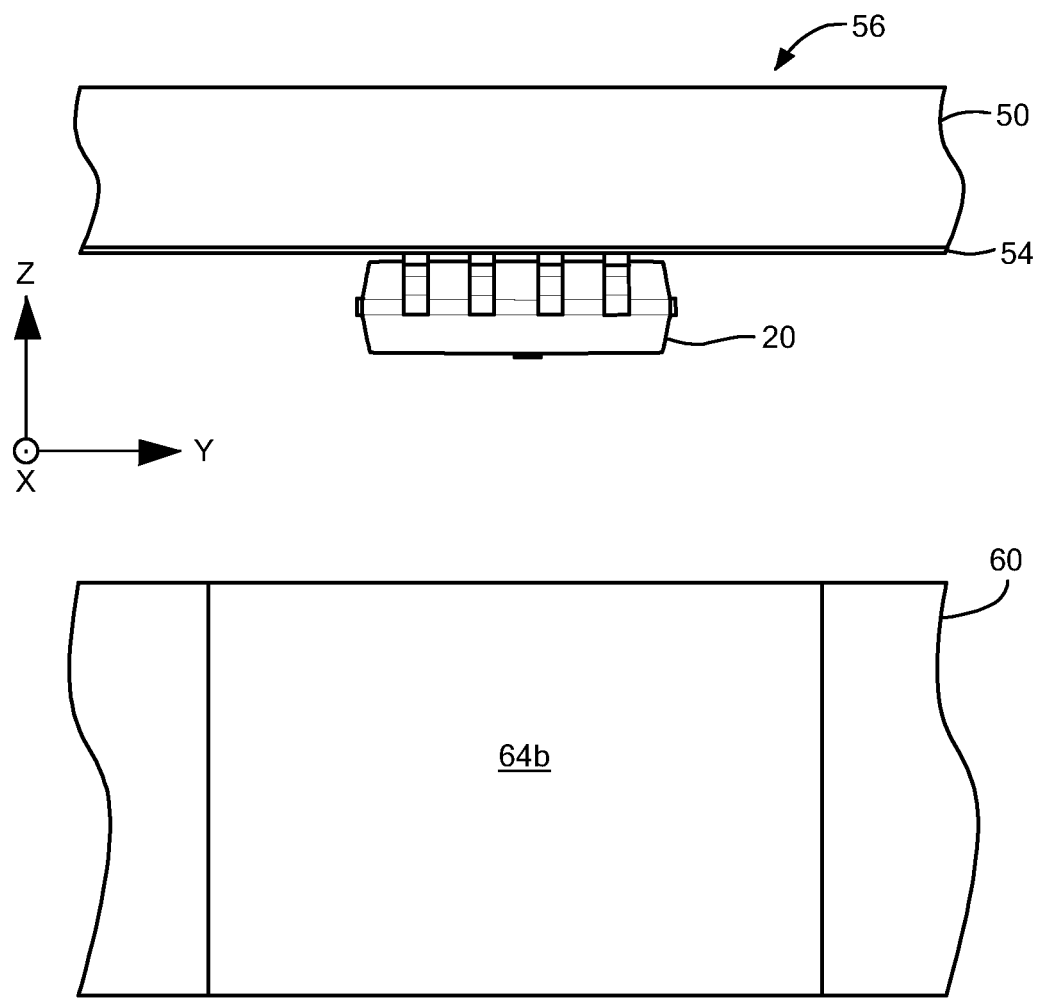
FIG. 2 is a side view of an alternative current sensor system including a PCB having a ground plane eddy current reduction feature according to the disclosure.

Referring also to FIG. 2, in some embodiments, the PCB and IC subassembly 56 can be inverted with respect to the configuration of FIGS. 1 and 1B. Such a configuration can bring the sensing elements 40a, 40b closer to the conductor 60 (i.e., can reduce the airgap) as may increase the magnetic field strength experienced by the sensing elements. The term "airgap" can refer to a distance between the sensing elements 40a, 40b and the primary conductor 60. In the described embodiments, the airgap can be approximately 2.5 mm.

Figure 3:
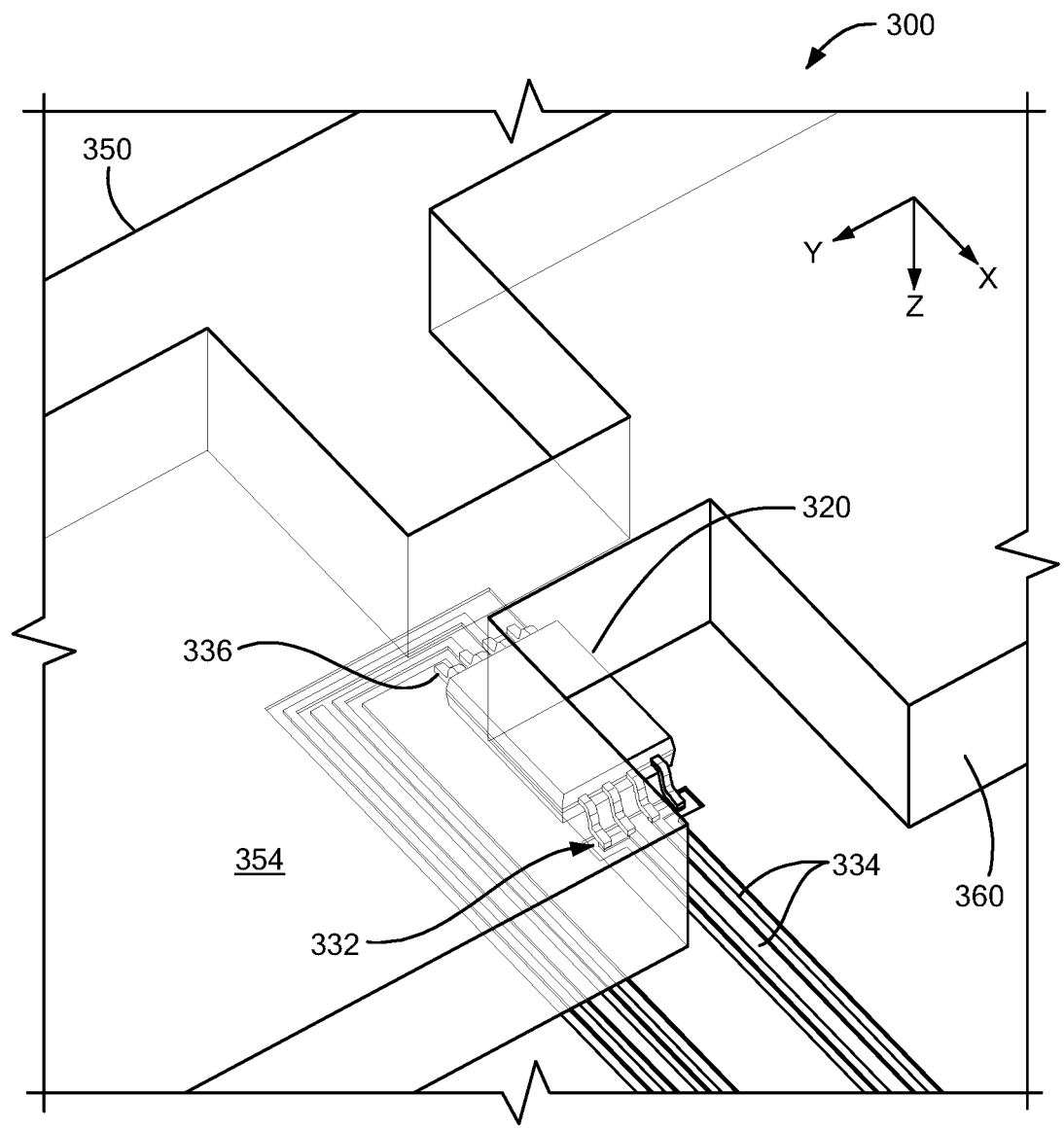
FIG. 3 is a perspective view of a conventional current sensor system including a PCB having a ground plane with conductive trace openings to accommodate conductive traces but without a ground plane eddy current reduction feature.

Referring to FIG. 3, a conventional current sensor system 300 includes a PCB 350 having a ground plane 354 but without a ground plane eddy current reduction feature and a current sensor IC 320 that may be the same as or similar to current sensor IC 20. FIG. 3 shows a PCB with a ground plane 354 on the same layer as conductive traces 334 with which signal connections are made between IC leads 332 and external circuits and systems (not shown). The ground plane 354 has openings that are shaped and sized just large enough to accommodate the conductive traces 334 with a minimum clearance (i.e., "conductive trace openings"), as shown. A typical minimum clearance for such conductive trace openings can be on the order of between 0.25 mm to 3 mm. One or more of the leads 332 (e.g., here a lead labelled 336) can be directly connected to the ground plane 354.

Figure 4:
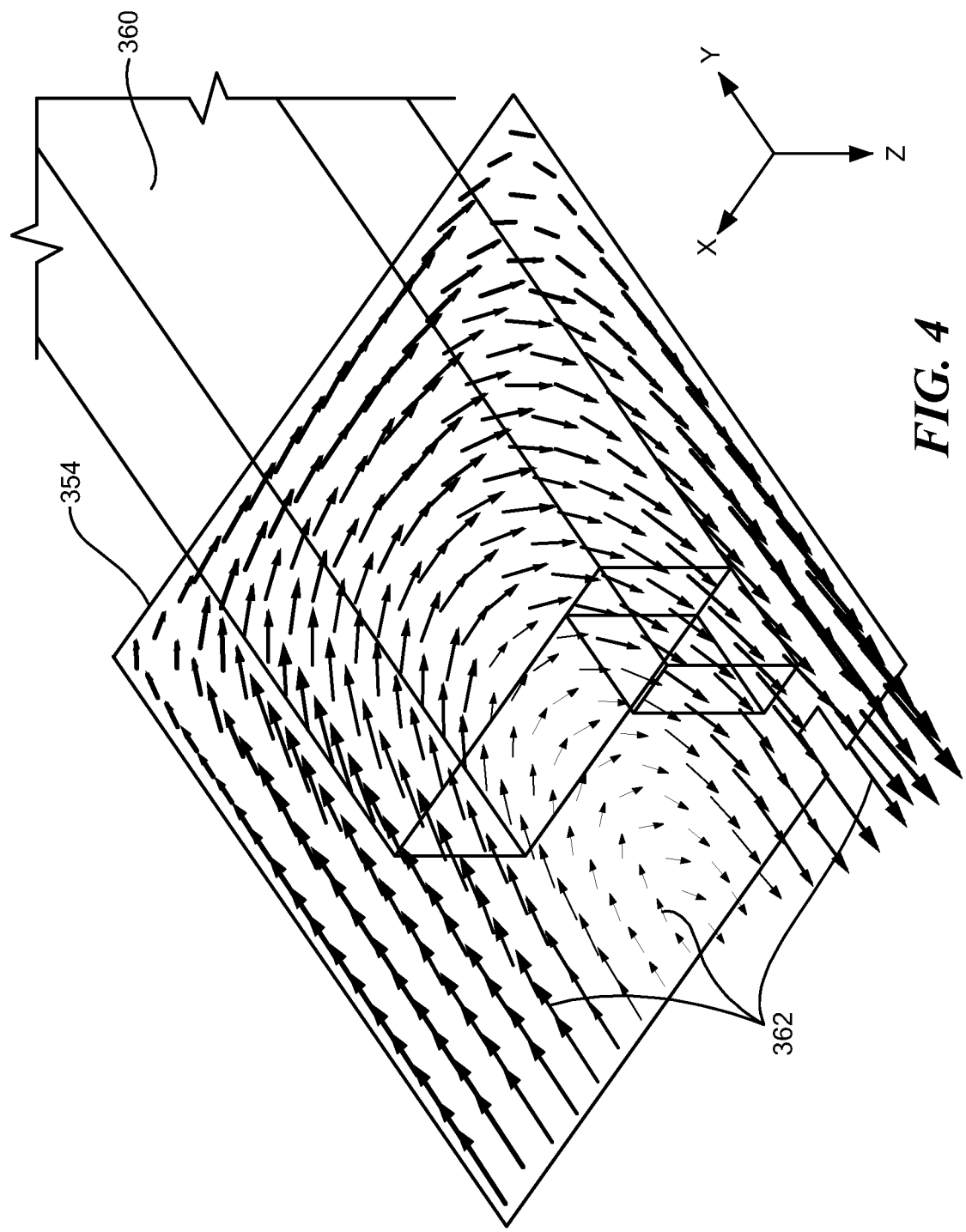
FIG. 4 is a perspective view of a portion of the current sensor system of FIG. 3 illustrating eddy current flow in the PCB ground plane.

Referring also to FIG. 4, a portion of the current sensor system 300 of FIG. 3 is shown, with arrows 362 illustrating example eddy current flow in the ground plane 354. For simplicity of illustration, the partial view of FIG. 4 shows only one-quarter of the conductor 360 and ground plane 354 as symmetries will yield similar eddy current flow in the other three quadrants of the system in the vicinity of the sensor IC 320. The relative length of the arrows 362 illustrates the eddy current distribution in the ground plane 354, with longer arrows denoting greater eddy current densities and shorter arrows denoting lesser eddy current densities. The illustrated eddy current distribution can correspond to an AC current in the conductor 360 of 10 kHz.

Figure 5:
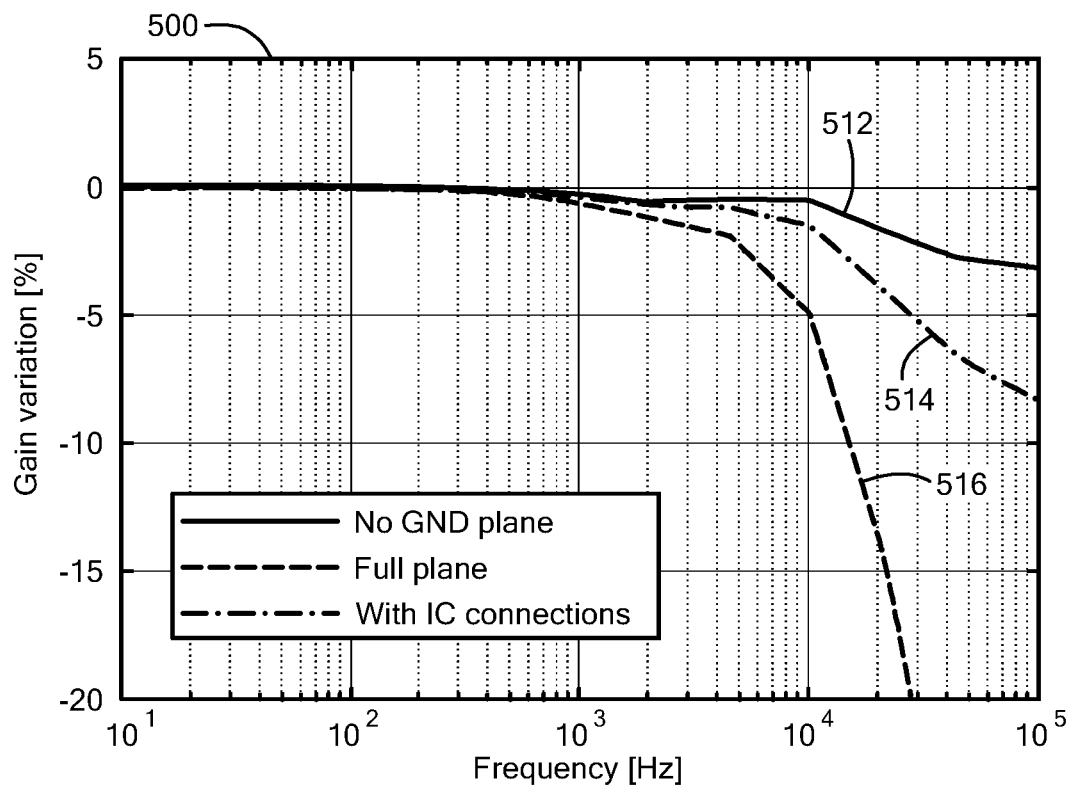
FIG. 5 is a graph illustrating current sensing gain variation over frequency for different PCB ground plane configurations.
Figure 5A:
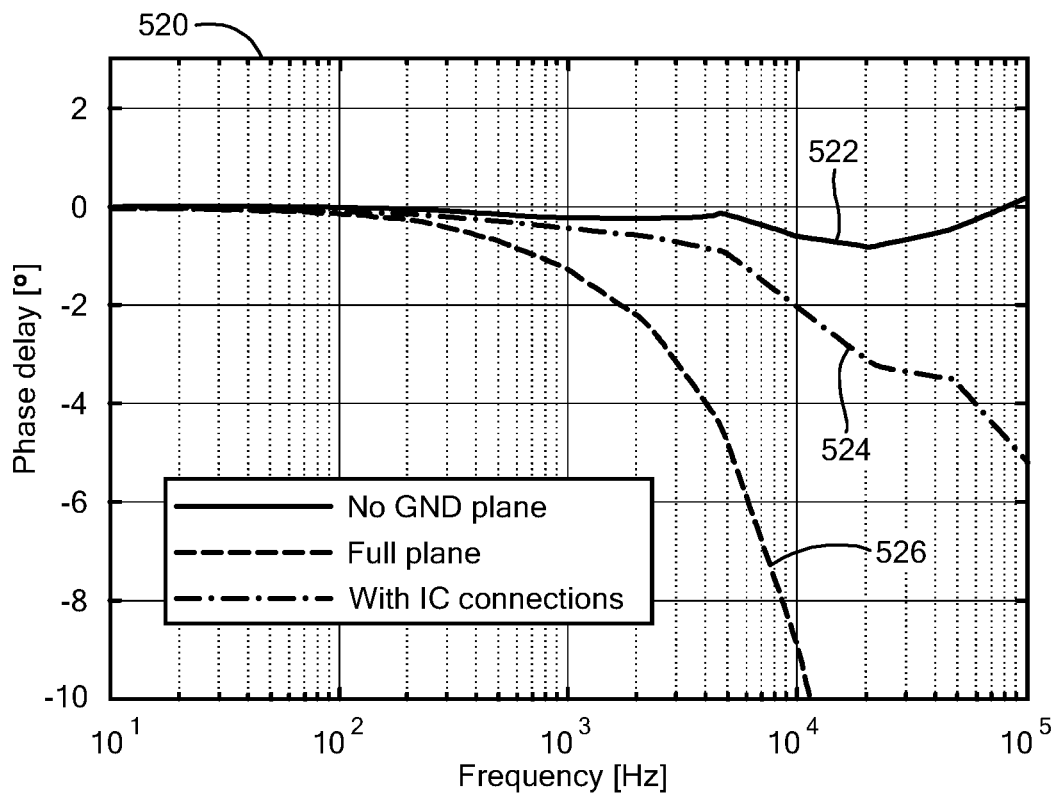
FIG. 5A is a graph illustrating current sensing phase delay over frequency for different PCB ground plane configurations.
Figure 5B:
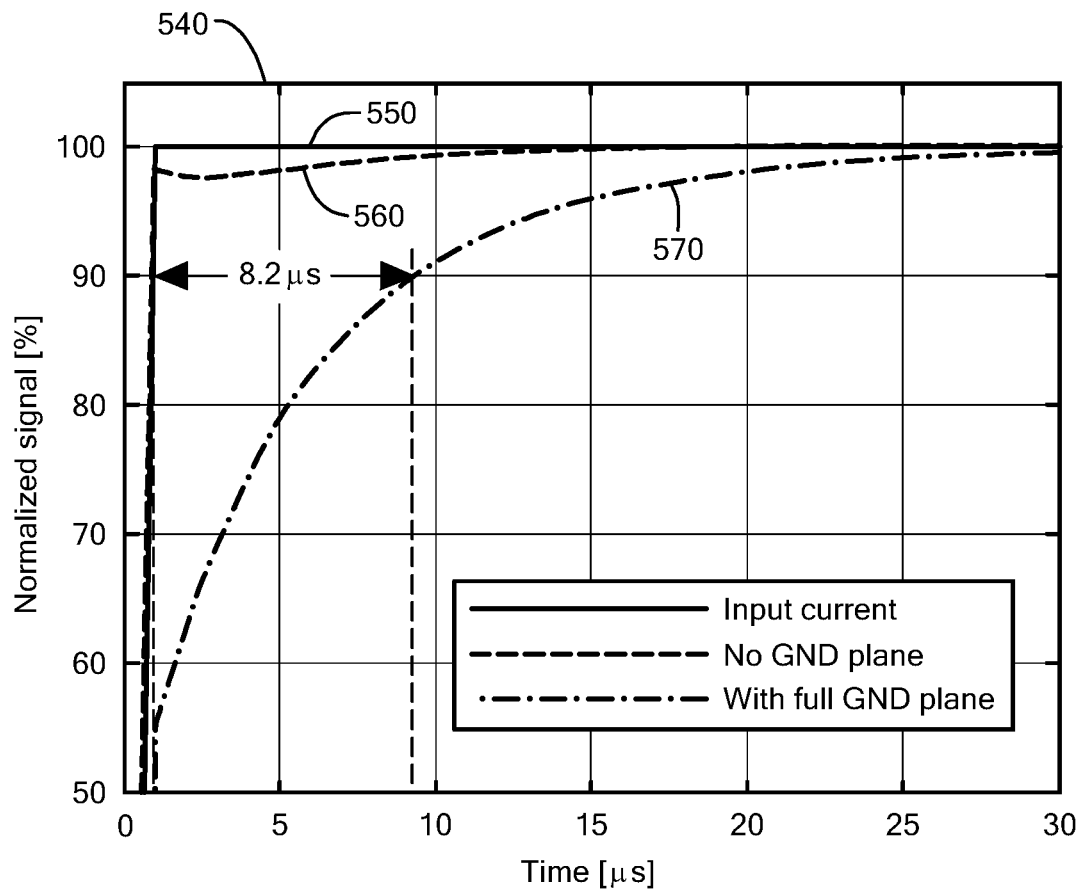
FIG. 5B is a graph illustrating current sensing response time for different PCB ground plane configurations.

Evaluation of the conventional current sensor system 300 of FIGS. 3 and 4 is illustrated by the graphs of FIGS. 5, 5A, and 5B. FIG. 5 is a graph 500 illustrating comparison of current sensing gain variation (in units of percentage along the vertical axis) over frequency of an AC primary current (in units of Hz along the horizontal axis) for different PCB ground plane configurations. Current sensing gain refers to a coupling factor between the measured magnetic field and the primary current (see term "cf" in equation 2 below). The PCB ground plane configurations are (1) a configuration without any ground plane as illustrated by curve 512, (2) a configuration with a ground plane having conductive trace openings to accommodate the conductive traces 334 as illustrated by curve 514, and (3) a configuration having a full ground plane (i.e., a ground plane without any openings or cuts or other interruptions in it) as illustrated by curve 516.

As is apparent from consideration of curve 512, without a ground plane, current sensing gain is relatively constant up to a current frequency on the order of 10 kHz. Curve 516 on the other hand reveals that having a full ground plane has a significant negative impact on the AC performance, since eddy current can flow freely in such a ground plane. In this scenario, the AC performance degrades significantly at primary current frequencies as low as 1 kHz. Curve 514 illustrates that having conductive trace openings in the ground plane to accommodate conductive traces 334 results in an improved performance as compared to having a full ground plane (i.e., curve 516), but still experiences more gain variation at higher frequencies than a system with no ground plane at all (i.e., curve 512).

FIG. 5A is a graph 520 illustrating comparison of current sensing phase delay (in units of degrees along the vertical axis) over frequency of an AC primary current (in units of Hz along the horizontal axis) for the same PCB ground plane configurations as FIG. 5. Phase delay refers to a delay by which the measured current lags the primary current. The PCB ground plane configurations are (1) a configuration without any ground plane as illustrated by curve 522, (2) a configuration with a ground plane having conductive trace openings to accommodate the conductive traces 334 as illustrated by curve 524, and (3) a configuration having a full ground plane as illustrated by curve 526.

As is apparent from consideration of curve 522, without a ground plane, there is little phase delay for primary current frequencies of less than 10 kHz. Curve 526 on the other hand reveals that having a full ground plane has a significant negative impact on the phase delay since eddy current can flow freely in such a ground plane. Curve 524 illustrates that having conductive trace openings in the ground plane to accommodate conductive traces 334 achieves a performance improvement as compared to having a full ground plane (i.e., curve 526), but still experiences more phase delay at higher frequencies than a system with no ground plane at all (i.e., curve 522).

Referring also to FIG. 5B, a graph 540 illustrates current sensing transient behavior by showing the normalized signal (in units of percentage along the vertical axis) over time (in units of microseconds along the horizontal axis) for no ground plane and full ground plane configurations. For example, in some current scenarios, such as in the case of a current surge, over current detection response time by the IC can be significantly adversely affected by eddy currents in the ground plane 354.

FIG. 5B includes a curve 550 illustrating an input current in the form of a 1 μs current ramp. In configurations without a ground plane, curve 560 illustrates the response time of a current sensor IC to the current 550. Curve 570 illustrates current detection response time in a configuration with a full ground plane. The 90% response time is approximately 8.2 μs (i.e., curve 570) as contrasted to a response time of less than approximately 0.1 μs in configurations without a ground plane (i.e., curve 560). While additional response time can be attributable to signal processing within the current sensor IC itself, curve 570 emphasizes the adverse effect of eddy currents in the ground plane.

According to the disclosure, PCB ground plane eddy current reduction features and designs reduce or eliminate eddy currents in the PCB ground plane by removing or interrupting the eddy current paths. In some embodiments, the ground plane feature can be substantially vertically aligned with the at least one magnetic field sensing element. With the described arrangements, current sensor performance is improved.

Figure 6:
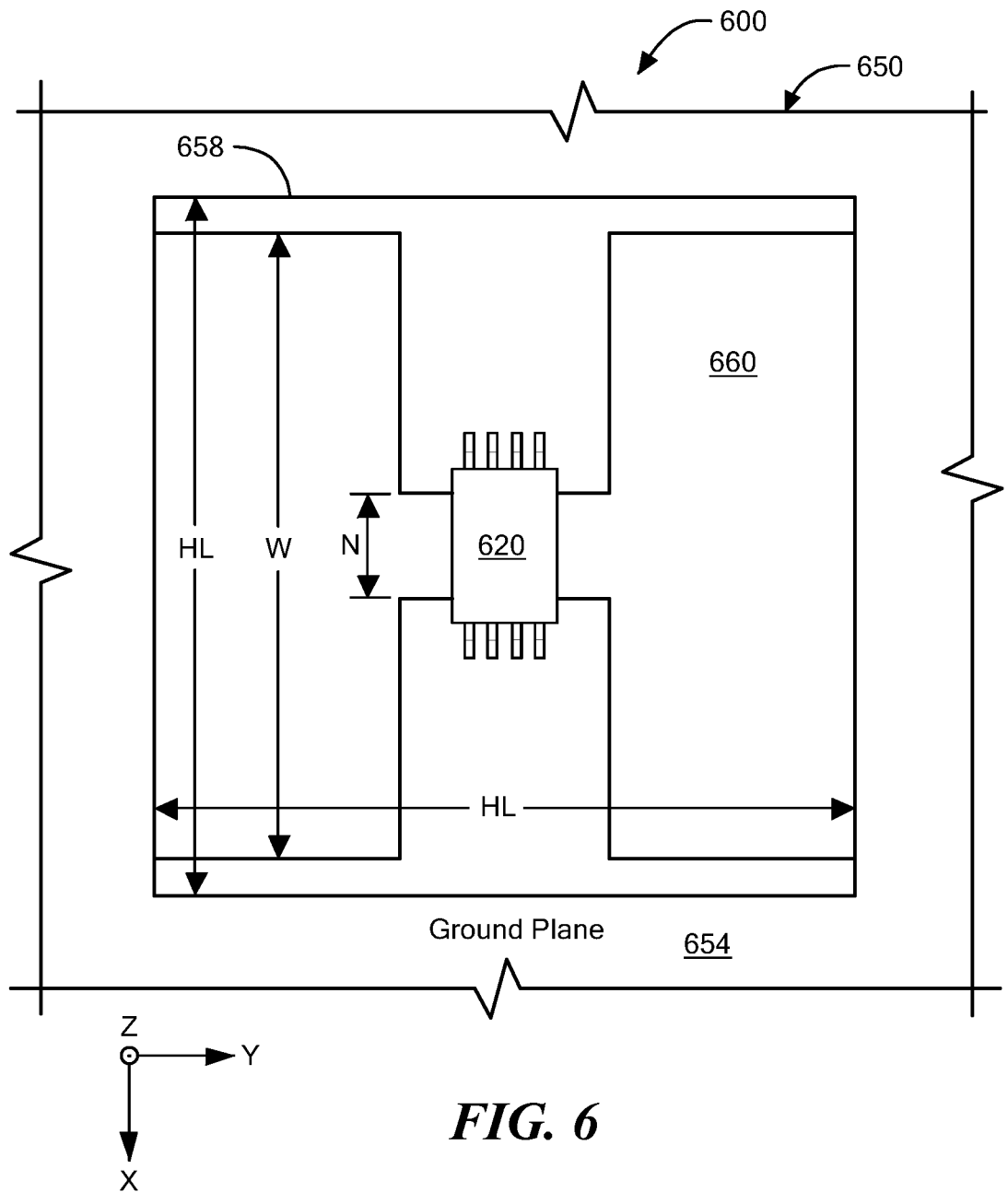
FIG. 6 is a plan view of a current sensor system including a PCB having a ground plane eddy current reduction feature according to the disclosure.

Referring to FIG. 6, a current sensor system 600 includes a current sensor IC 620 and a PCB 650 having a ground plane eddy current reduction feature 658 in the form of a hole in the ground plane 654. The current sensor IC 620 can be the same as or similar to IC 20 of FIGS. 1 and 1A. Thus, IC 620 can include at least one magnetic field sensing element (not shown) supported by a semiconductor die and configured to sense a current in a proximate primary conductor 660. Conductor 660 can be the same as or similar to conductor 60 of FIG. 1.

The ground plane hole 658 can have various shapes and sizes. The example hole 658 has a square shape with a dimension of "HL" in both directions, as shown. In general, the ground plane hole 658 has a dimension larger than a dimension of the IC 620, as shown.

Figure 7:
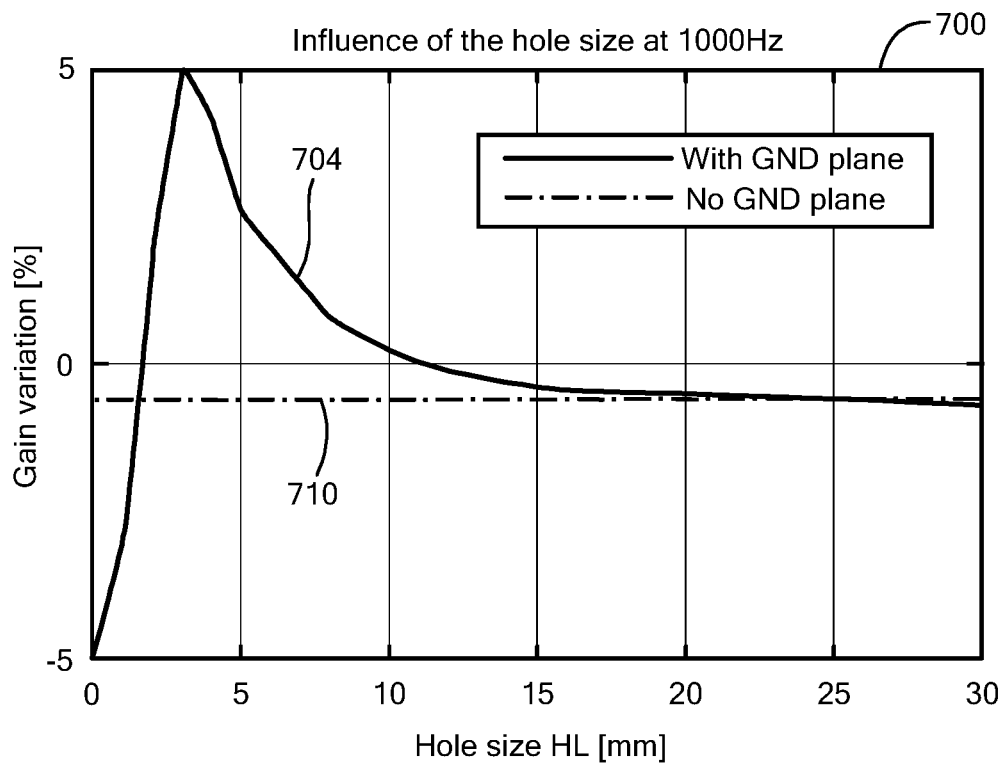
FIG. 7 is a graph illustrating current sensing gain variation over a dimension of the PCB ground plane feature of FIG. 6.
Figure 7A:
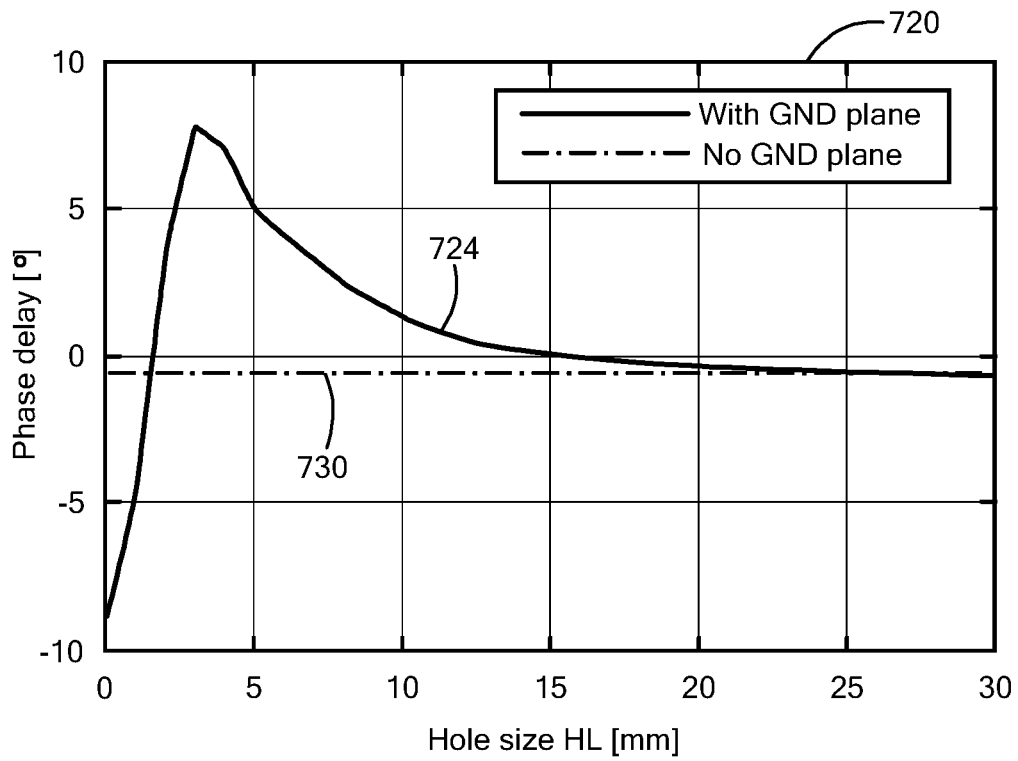
FIG. 7A is a graph illustrating current sensing phase delay over a dimension of the PCB ground plane feature of FIG. 6.

The size of the ground plane hole 658 of FIG. 6 can be evaluated and optimized with reference to FIGS. 7 and 7A. FIG. 7 is a graph 700 illustrating comparison of current sensing gain variation (in units of percentage along the vertical axis) over the size of the hole 658 (in units of millimeters of hole dimension HL along the horizontal axis) for an AC primary current frequency of 1 kHz for different PCB ground plane configurations. In particular, the evaluated PCB ground plane configurations are (1) a configuration without any ground plane as illustrated by curve 710 and (2) a configuration having a ground plane with a hole as illustrated by curve 704.

Consideration of curve 704 reveals that the size HL of the hole 658 should be greater than approximately 15 mm in order to achieve the same performance as without a ground plane as shown by curve 710. This data presumes a width "W" of conductor 660 of less than approximately 30 mm and any reasonable notch width "N" such as a notch width of less than approximately 10 mm.

It will be appreciated by those of ordinary skill in the art that hole 658 can have shapes other than the illustrated square, such as a rectangle, for example with a smallest dimension of at least 15 mm or a circle with a radius of at least 7.5 mm. More generally, the ground plane hole 658 can be of any shape that results in the closest distance from the center of the current sensor IC 620 to the ground plane 654 being on the order of at least 7.5 mm. Furthermore, square or rectangular hole shapes can have squared corners as shown or rounded corners.

As possible non-limiting variations to this and other embodiments, the ground plane 654 can be on a single PCB layer or can include ground planes on multiple PCB layers, the ground plane can have various thicknesses, and/or can comprise various conductive materials. It will be appreciated by those of ordinary skill in the art that the hole 658 would be formed in each of the ground plane layers in the case of multiple ground planes on multiple PCB layers.

Figure 8:
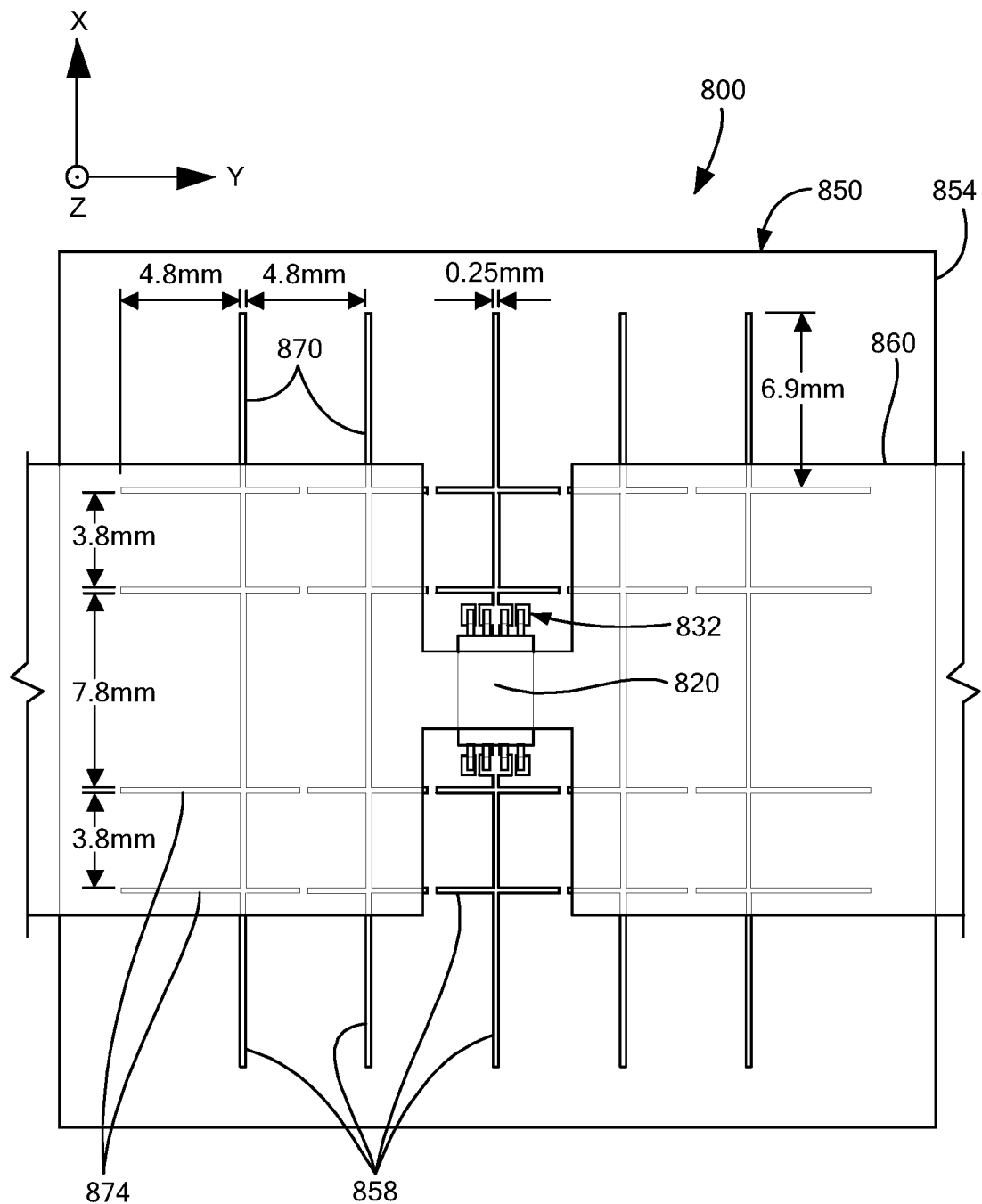
FIG. 8 is a plan view of a current sensor system including an alternative PCB ground plane eddy current reduction feature according to the disclosure.

Referring to FIG. 8, a current sensor system 800 includes a current sensor IC 820 and a PCB 850 having a ground plane 854 with an eddy current reduction feature 858 in the form of a plurality of cuts. The current sensor IC 820 can be the same as or similar to IC 20 of FIGS. 1 and 1A. Thus, IC 820 can include at least one magnetic field sensing element (not shown) supported by a semiconductor die and configured to sense a current in a proximate primary conductor 860. Conductor 860 can be the same as or similar to conductor 60 of FIG. 1.

One or more leads 832 of the IC 820 can be coupled to the ground plane 854 and others of leads 832 can be coupled to signal traces on layers of the PCB other than the ground plane layer. Here, leads 832 are not coupled directly to the ground plane 854 as illustrated by openings in the ground plane 854 sized just large enough to accommodate the leads (i.e., lead openings).

The cuts 858 in the ground plane 854 can be elongated and can include a first plurality of elongated cuts 870 extending in a first direction (as may coincide with the labeled x-axis) and a second plurality of elongated cuts 874 extending in a second direction (as may coincide with the labeled y-axis), which second direction is substantially orthogonal with respect to the first direction. Additionally, at least some of the elongated cuts (here cuts 874) can be discontinuous, as shown.

Example dimensions between adjacent elongated cuts 870 and between adjacent elongated cuts 874 are labelled and are illustrative only. The distance between adjacent cuts can be the same or different. For example, adjacent cuts 874 can be spaced by a first distance on the order of 3.8 mm or a second distance on the order of 7.8 mm, as shown, in order to thereby form square or rectangular ground plane segments of different lengths. In general, a typical distance between adjacent cuts can be on the order of between 1 mm to 10 mm. The closer the cuts are to each other, the better the rejection of eddy currents.

The width of each elongated cut 870 does not generally affect the eddy current reduction as long as the eddy current path is interrupted. Typical widths can be between approximately 50 μm to 1 mm. In the example embodiment, the cut width is 0.25 mm as labeled.

Elongated cuts 858 interrupt the eddy currents in the ground plane 854 while still preserving much of the ground plane. The effect of the elongated cuts 858 is illustrated by graphs in FIGS. 9, 9A, and 9B.

Figure 9:
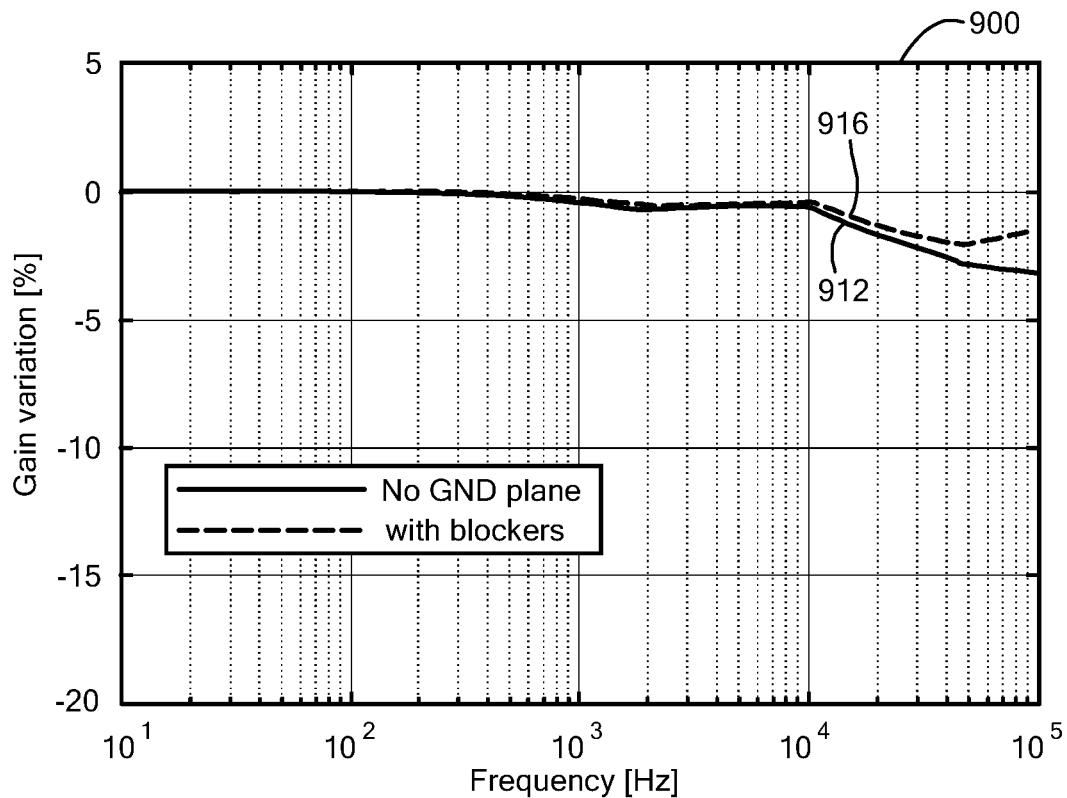
FIG. 9 is a graph illustrating current sensing gain variation over frequency for different PCB ground plane configurations.

Referring to FIG. 9, a graph 900 illustrates comparison of current sensing gain variation (in units of percentage along the vertical axis) over frequency of an AC primary current (in units of Hz along the horizontal axis) for a configuration without a ground plane in curve 912 and for a configuration with the eddy current blocking feature in the form of elongated cuts 858 as shown by curve 916.

As is apparent from consideration of curve 912, without a ground plane, current sensing gain varies very little up until a current frequency on the order of 10 kHz. Curve 916 illustrates that having elongated cuts 858 in the ground plane 854 provides essentially the same as the performance as having no ground plane at all (i.e., curve 912), at least up to frequencies on the order of 10 kHz.

Figure 9A:
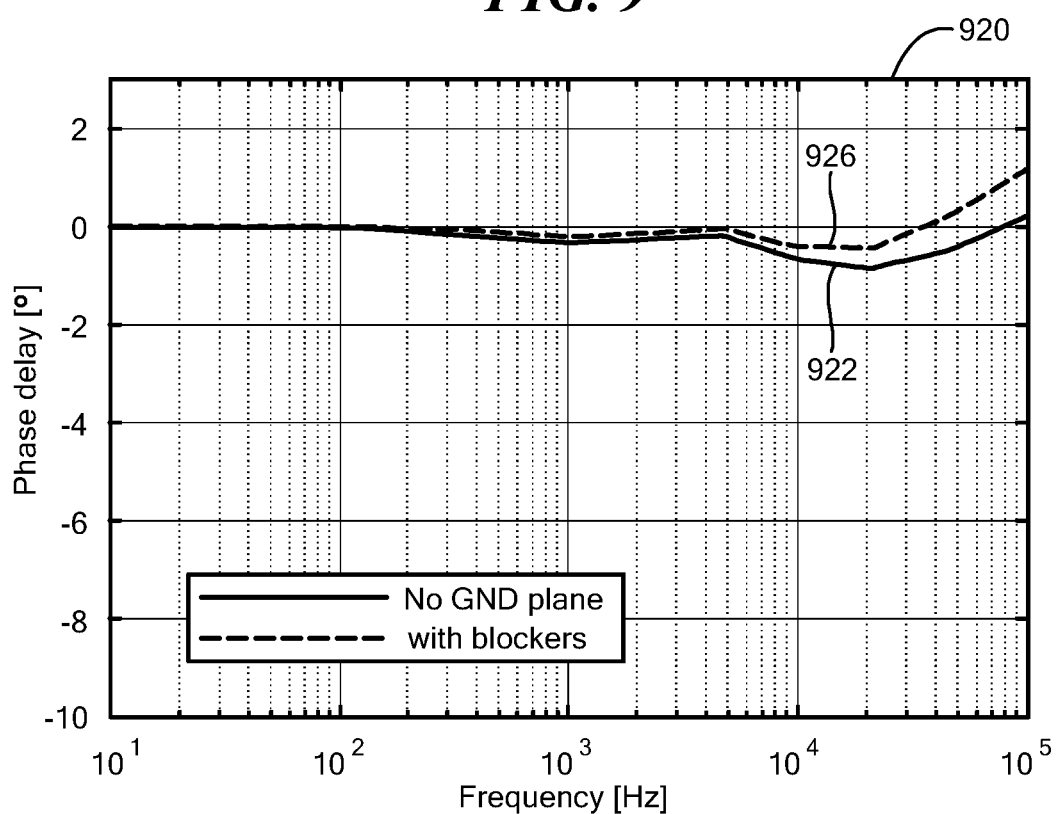
FIG. 9A is a graph illustrating current sensing phase delay over frequency for different PCB ground plane configurations.

Referring also to FIG. 9A, graph 920 illustrates comparison of current sensing phase delay (in units of degrees along the vertical axis) over frequency of an AC primary current (in units of Hz along the horizontal axis) for a configuration without a ground plane in curve 922 and for a configuration with the eddy current blocking feature in the form of elongated cuts 858 as shown by curve 926.

As is apparent from consideration of curves 922 and 926, there is very little phase delay up to primary AC current frequencies of approximately 10 kHz, for configurations without any ground plane and for configurations with the elongated cuts 858 in the ground plane 854. At higher AC current frequencies, there is slightly more phase delay with the elongated cuts 858 than without any ground plane, as shown.

Figure 9B:
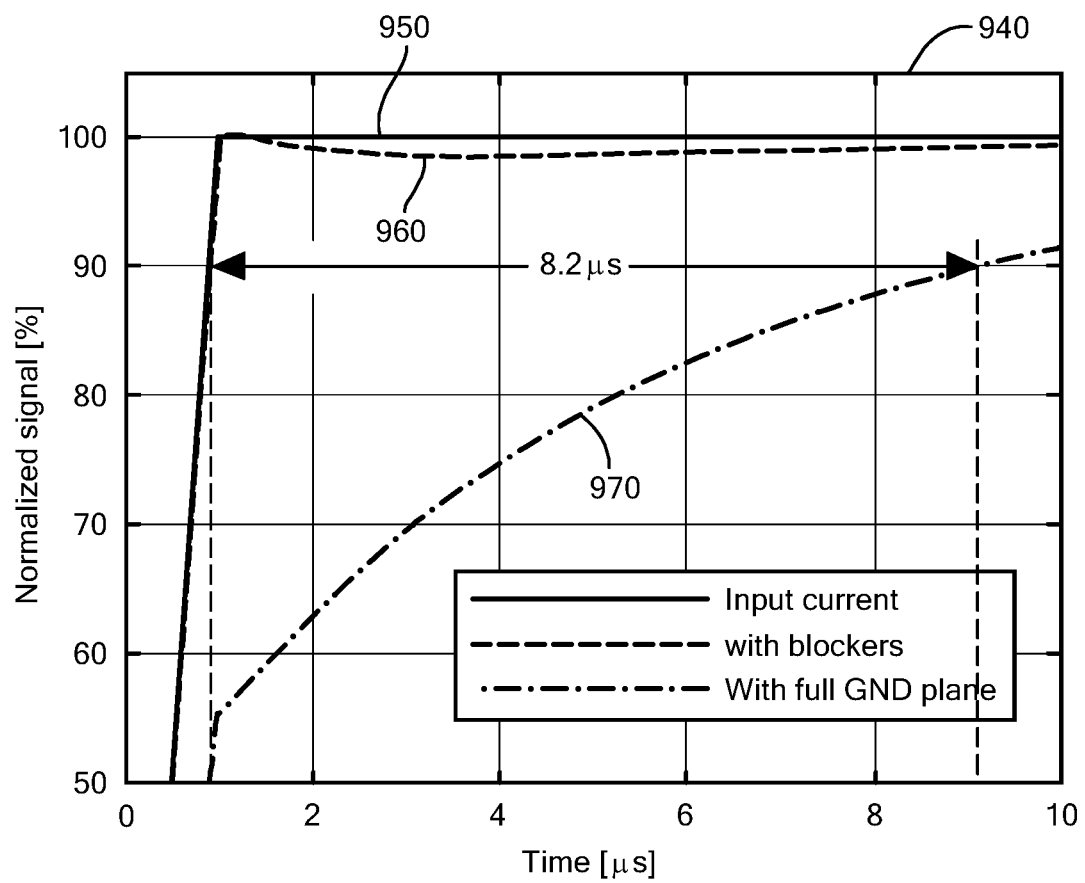
FIG. 9B is a graph illustrating current sensing response time for different PCB ground plane configurations.

Referring to FIG. 9B, a graph 940 illustrates current sensing transient behavior in response to a normalized input current signal (in units of percentage along the vertical axis) over time (in units of microseconds along the horizontal axis). In particular, a curve 950 illustrates an example input current in the form of a 1 μs current ramp. In configurations with the elongated cuts 858 in the ground plane 854, curve 960 illustrates the response time of a current sensor IC 820 to the current of curve 950. Curve 970 illustrates current detection response time in a configuration with a full ground plane. In configurations with a full ground plane, the 90% response time is approximately 8.2 μs (i.e., curve 970) as contrasted to a response time of less than approximately 0.1 μs in configurations with elongated cuts 858 in the ground plane 854 (i.e., curve 960). While additional response time can be attributable to signal processing within the current sensor IC itself, curve 970 emphasizes the adverse effect of eddy currents in the ground plane.

Figure 10:
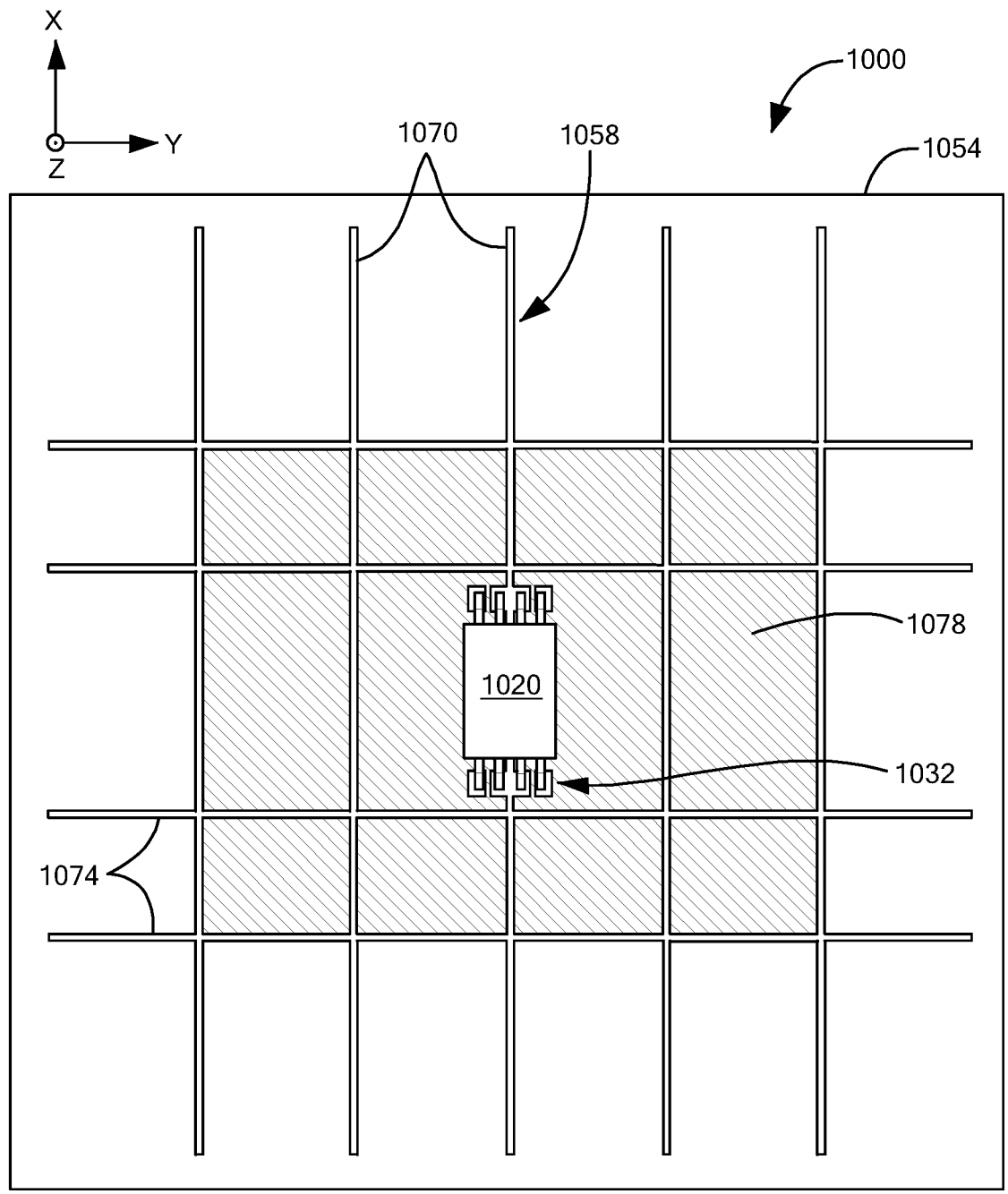
FIG. 10 is a plan view of a current sensor system including an alternative PCB ground plane eddy current reduction feature according to the disclosure.

Referring to FIG. 10, an IC and PCB subassembly 1000 illustrates an alternative eddy current reduction feature in a PCB ground plane 1054 in the form of cuts 1058. Subassembly 1000 includes a current sensor IC 1020 that can be the same as or similar to IC 20 of FIGS. 1 and 1A. Thus, IC 1020 can include at least one magnetic field sensing element supported by a semiconductor die and configured to sense a primary current in a proximate conductor (not shown).

The cuts 1058 in the ground plane 1054 can be elongated and can include a first plurality of elongated cuts 1070 extending in a first direction (as may coincide with the labeled x-axis) and a second plurality of elongated cuts 1074 extending in a second direction (as may coincide with the labeled y-axis), which second direction is substantially orthogonal with respect to the first direction. One of the directions of cuts 1070 or 1074 can be substantially parallel to a direction of the IC leads 1032, as shown. Dimensions and relative spacing of elongated cuts 1058 can be the same as or similar to elongated cuts 858 of FIG. 8.

Elongated cuts 1058 can be continuous, as shown. Elongated cuts 1058 can be arranged to electrically isolate a portion 1078 from the ground plane 1054. In some embodiments, cross-hatched portion 1078 can be floating for example.

One or more leads 1032 of the IC 1020 can be coupled to signal traces on layers of the PCB other than the ground plane layer. One or more other leads can be coupled to the ground plane 1054, although not by a direct coupling in the embodiment of FIG. 10 since portion 1078 is not coupled to ground.

Figure 11:
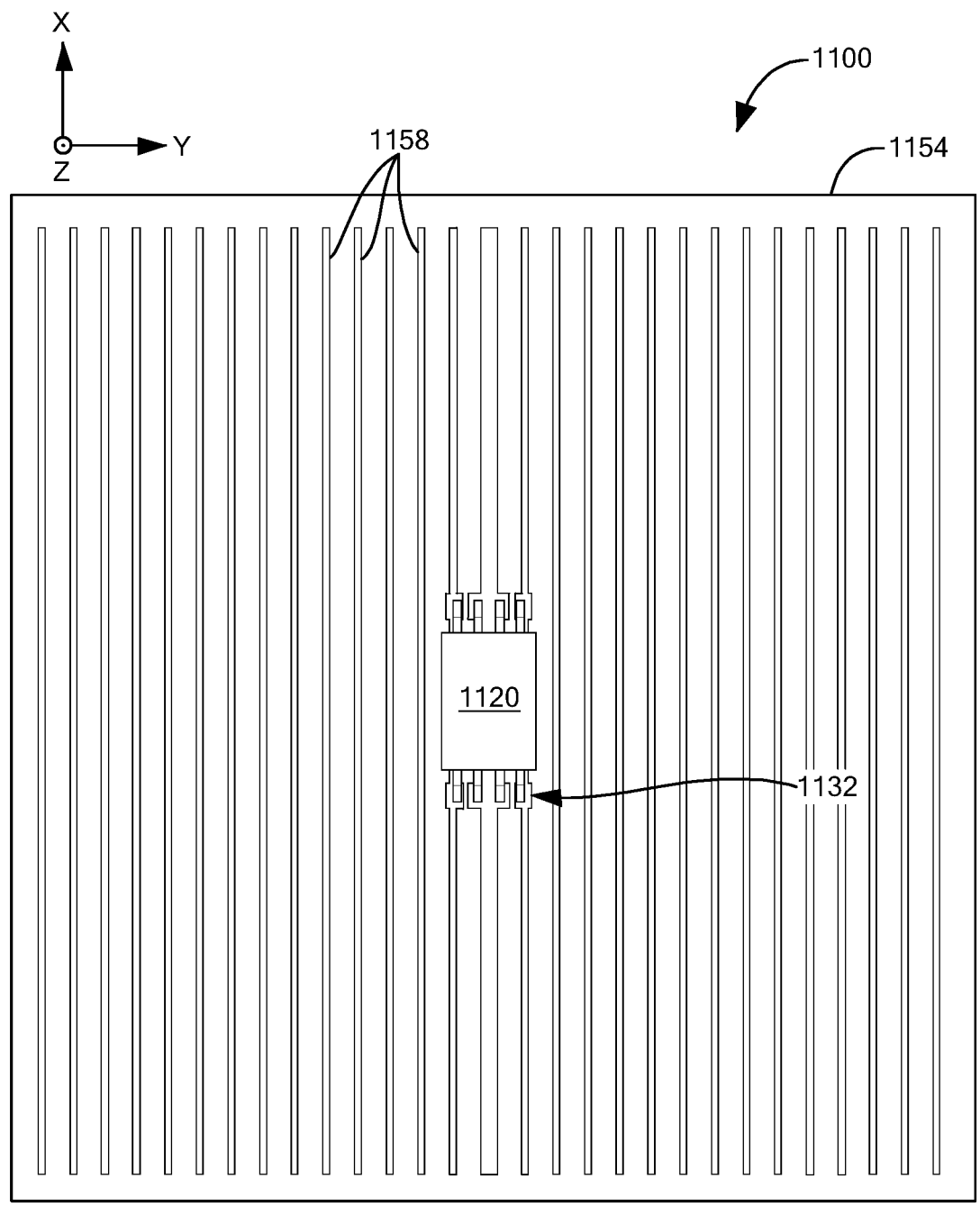
FIG. 11 is a plan view of a current sensor system including an alternative PCB ground plane eddy current reduction feature according to the disclosure.

Referring also to FIG. 11, an IC and PCB subassembly 1100 illustrates an alternative eddy current reduction feature in the PCB ground plane 1154 in the form of elongated cuts 1158. Subassembly 1100 includes a current sensor IC 1120 that can be the same as or similar to IC 20 of FIGS. 1 and 1A. Thus, IC 1120 can include at least one magnetic field sensing element (not shown) supported by a semiconductor die and configured to sense a current in a proximate primary conductor (not shown) and one or more leads 1132 with which electrical connection can be made between the IC and other circuits and systems.

Elongated cuts 1158 can be continuous and can extend in only a single direction, here in a vertical direction coinciding with a labeled x-axis and being substantially parallel with respect to one or more of the leads 1132, as shown.

The distance between adjacent elongated cuts 1158 can be the same as shown or can be different and in an example application can be on the order of 0.75 mm. Each of the cuts 1158 can have the same width or one or more such cuts can have a wider width, as shown in the center of FIG. 11 for a wider cut that spans adjacent IC leads 1132.

One or more of the IC leads 1132 can be coupled to the ground plane 1154 and others of leads 1132 can be coupled to signal traces on layers of the PCB other than the ground plane layer. Here, leads 1132 are not coupled directly to the ground plane 1154 as illustrated by openings in the ground plane 1154 sized just large enough to accommodate the leads (i.e., lead openings).

Figure 12:
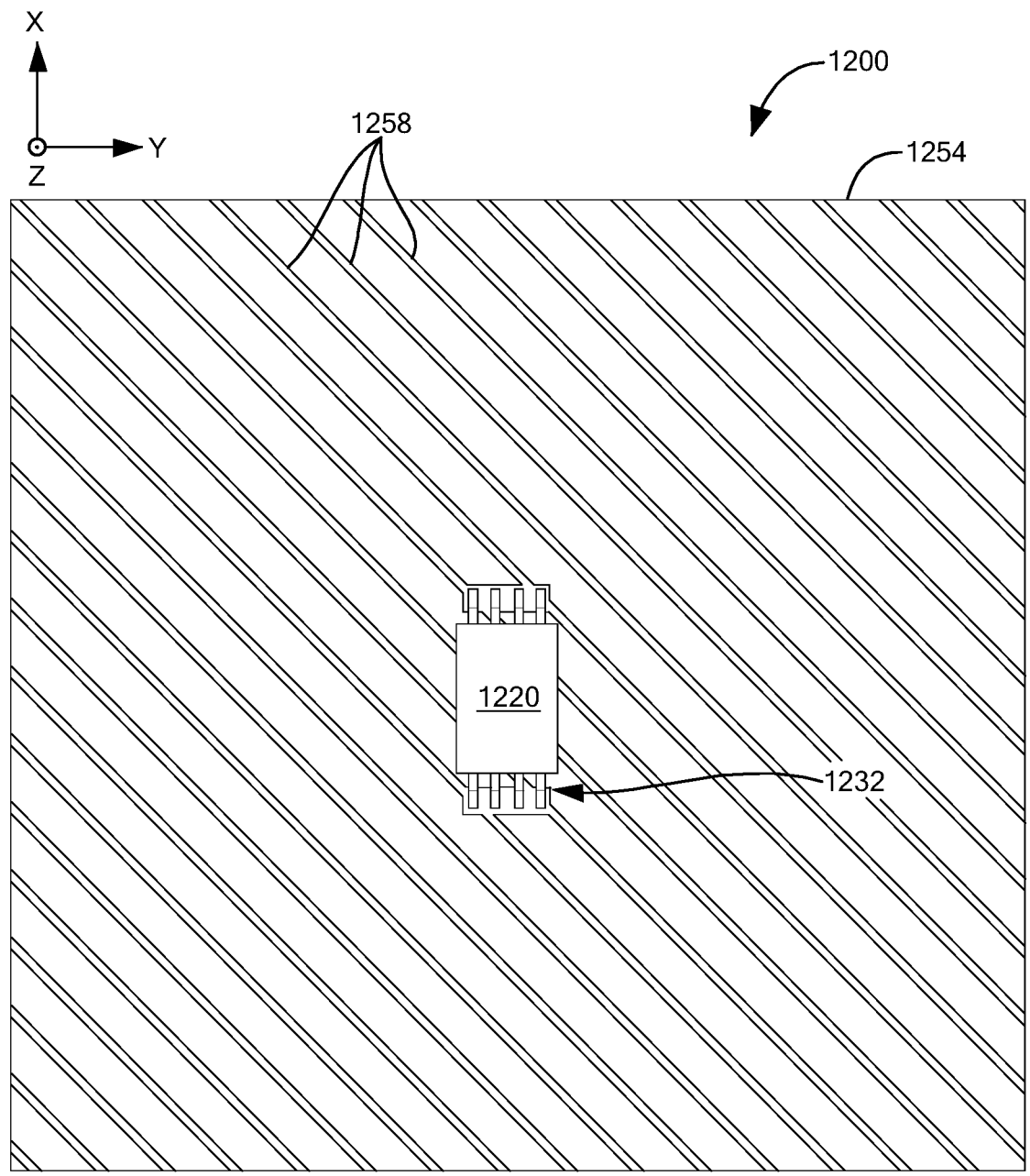
FIG. 12 is a plan view of a current sensor system including an alternative PCB ground plane eddy current reduction feature according to the disclosure.

Referring also to FIG. 12, an IC and PCB subassembly 1200 illustrates an alternative eddy current reduction feature in the PCB ground plane 1254 in the form of elongated cuts 1258. Subassembly 1200 includes a current sensor IC 1220 that can be the same as or similar to IC 20 of FIGS. 1 and 1A. Thus, IC 1120 can include at least one magnetic field sensing element (not shown) supported by a semiconductor die and configured to sense a current in a proximate primary conductor (not shown) and one or more leads 1232 with which electrical connection can be made between the IC and other circuits and systems.

Like cuts 1158 of FIG. 11, cuts 1258 are continuous and extend in a single direction. Cuts 1258 differ from the cuts 1158 of FIG. 11 at least in that they are angled by other than ninety-degrees or zero degrees (i.e., parallel) with respect to the leads 1232. For example, the cuts 1258 can be described as being diagonal with respect to the IC leads 1232.

The distances between adjacent elongated cuts 1258 can be the same or different. Further, each of the cuts 1258 can have the same width as shown or one or more such cuts can have a different width.

One or more of the IC leads 1232 can be coupled to the ground plane 1254 and others of leads 1232 can be coupled to signal traces on layers of the PCB other than the ground plane layer. Here, leads 1232 are not coupled directly to the ground plane 1254 as illustrated by openings in the ground plane 1254 sized just large enough to accommodate the leads (i.e., lead openings).

Figure 13:
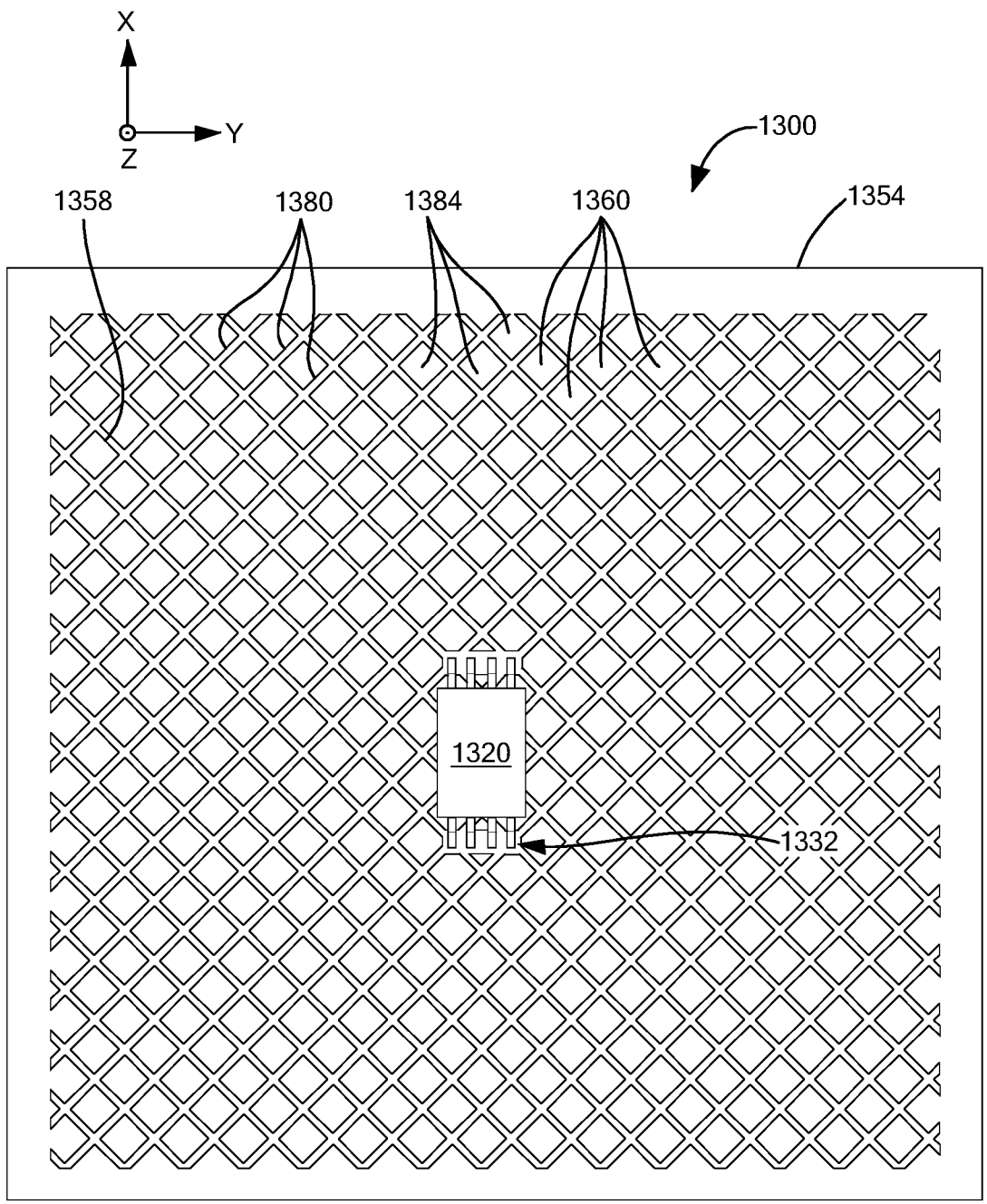
FIG. 13 is a plan view of a current sensor system including an alternative PCB ground plane feature according to the disclosure.

Referring to FIG. 13, an IC and PCB subassembly 1300 illustrates an alternative eddy current reduction feature in the PCB ground plane 1354 in the form of elongated cuts 1384. Subassembly 1300 includes a current sensor IC 1320 that can be the same as or similar to IC 20 of FIGS. 1 and 1A. Thus, IC 1320 can include at least one magnetic field sensing element (not shown) supported by a semiconductor die and configured to sense a current in a proximate primary conductor (not shown) and one or more leads 1332 with which electrical connection can be made between the IC and other circuits and systems.

Like cuts 1058 of FIG. 10, cuts 1358 are continuous and extend in two orthogonal directions, with cuts 1380 extending in a first direction and cuts 1384 extending in a second direction generally orthogonal with respect to the first direction, as shown. However, cuts 1358 differ from the cuts 1058 of FIG. 10 at least in that they are diagonal with respect to at least one of the IC leads 1232 (e.g., the cuts 1358 are angled by other than ninety-degrees or zero degrees (i.e., parallel) with respect to the leads 1232). The result of cuts 1358 is a plurality of squares 1360, each of which is isolated from the surrounding ground plane 1354 and can be floating.

The distances between adjacent elongated cuts 1358 can be the same or different. Further, each of the cuts 1358 can have the same width as shown or one or more such cuts can have a different width.

One or more of the IC leads 1332 can be coupled to the ground plane 1354 and others of leads 1332 can be coupled to signal traces on layers of the PCB other than the ground plane layer. Here, leads 1332 are not coupled directly to the ground plane 1354 as illustrated by openings in the ground plane 1354 sized just large enough to accommodate the leads (i.e., lead openings).

Figure 14:
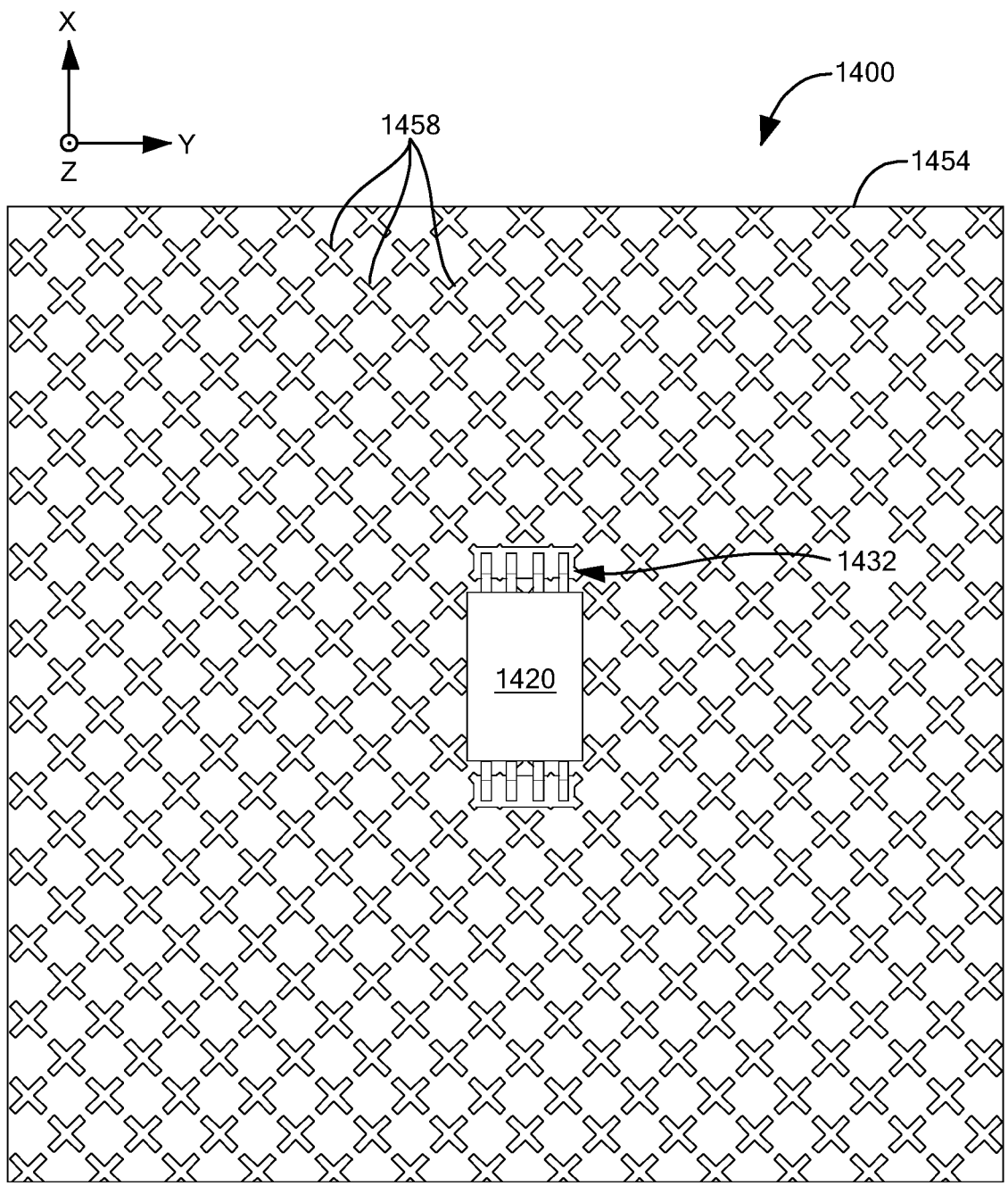
FIG. 14 is a plan view of a current sensor system including an alternative PCB ground plane eddy current reduction feature according to the disclosure.

Referring to FIG. 14, an IC and PCB subassembly 1400 illustrates an alternative eddy current reduction feature in the PCB ground plane 1454 in the form substantially x-shaped cuts 1458. Subassembly 1400 includes a current sensor IC 1420 that can be the same as or similar to IC 20 of FIGS. 1 and 1A. Thus, IC 1420 can include at least one magnetic field sensing element (not shown) supported by a semiconductor die and configured to sense a current in a proximate primary conductor (not shown) and one or more leads 1432 with which electrical connection can be made between the IC and other circuits and systems.

Eddy current reduction cuts 1458 are shown to be substantially x-shaped, or diagonal cuts or cutouts. In this sense, such cuts 1458 can be described as being similar to the elongated diagonal cuts of FIG. 13, but with such elongated cuts being discontinuous. It will be appreciated by those of ordinary skill in the art that modifications can be made to the x-shaped cuts 1458, such as rotating them by forty-five degrees so that they are plus shaped "+" instead of x-shaped "x" for example.

The distances between adjacent x-shaped cuts 1458 can be the same as illustrated or different. Further, each of the x-shaped cuts 1458 can have the same width as shown or one or more such cuts can have a different width.

One or more of the IC leads 1432 can be coupled to the ground plane 1454 and others of leads 1432 can be coupled to signal traces on layers of the PCB other than the ground plane layer. Here, leads 1432 are not coupled directly to the ground plane 1454 as illustrated by openings in the ground plane 1454 sized just large enough to accommodate the leads (i.e., lead openings).

Having considered various eddy current reduction features in connection with FIGS. 8 and 10-14, it will be appreciated by those of ordinary skill in the art that various modifications to the described and illustrated ground plane eddy current reduction features are possible while still obtaining the eddy current reduction advantages. A few non-limiting example modifications include providing various widths of the ground plane cuts, providing the ground plane on a single PCB layer or ground planes on multiple PCB layers, providing the ground plane with various thicknesses, providing cuts (elongated or otherwise) in various directions with respect to the IC leads such as parallel, orthogonal, or at any other angle as can be referred to as diagonal, and/or can using different conductive materials to provide the ground plane.

Further, it will be appreciated that knowledge of eddy current distribution in a ground plane in a particular application (e.g., for a given conductor with particular notch dimensions, a given primary AC current and frequency range) can facilitate optimization of the eddy current reduction features by identifying main eddy current paths to be interrupted by the eddy current reduction features. For example, consideration of the eddy current distribution in FIG. 4 can be used to determine an optimal cut pattern and size. Further, attributes of the proximate conductor can be taken into consideration when designing optimal ground plane eddy current reduction features. For example, if the conductor is curved, then it may be desirable to provide the eddy current reduction features in the form of curved cuts in the ground plane.

Figure 15:
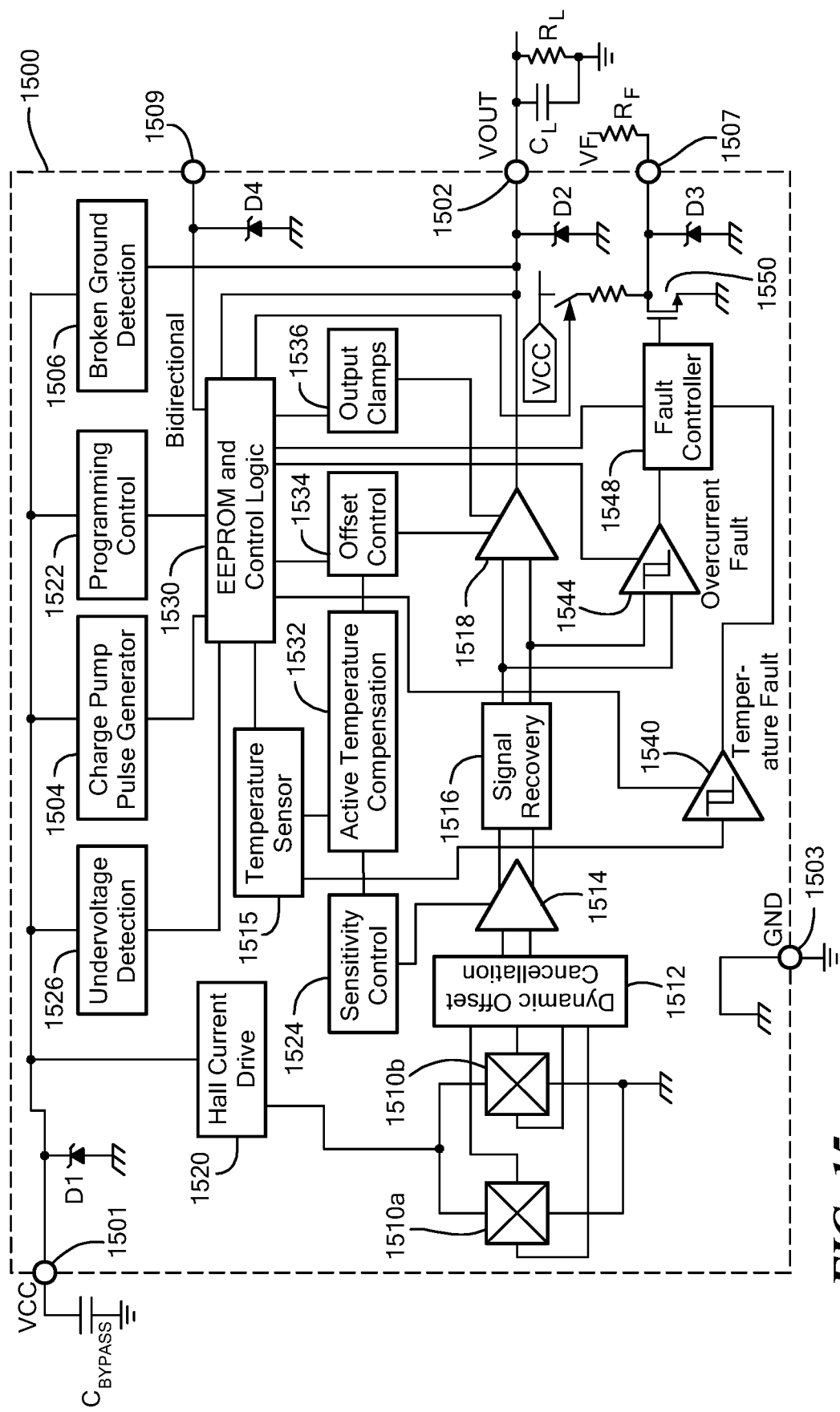
FIG. 15 is a schematic showing example circuitry of a current sensor IC according to the disclosure.

Referring to FIG. 15, a schematic block diagram of an example current sensor IC 1500 that can be the same as or similar to current sensor 20 includes one or more magnetic field sensing elements, and here two sensing elements 1510a, 1510b. Sensing elements 1510a, 1510b can be Hall effect elements or other magnetic field transducer element types. It will be appreciated that sensor 1500 is presented as a non-limiting example of circuitry suitable for sensor 20 according to the disclosure.

Use of two or more spaced sensing elements 1510a, 1510b permits differential magnetic field sensing, as may be advantageous to improve immunity (i.e., insensitivity) to common-mode stray magnetic fields. The output of the sensor VOUT is proportional to $\Delta B = B_R - B_L$ where $B_R$ represents magnetic field incident on one of the sensing elements (e.g., so-called "right" sensing element 1510b) and $B_L$ represents magnetic field incident on the other one of the sensing elements (e.g., so-called "left" sensing element 1510a). Example spacing between sensing elements 1510a, 1510b can be on the order of 2 mm.

As discussed above, current sensing accuracy can be adversely affected by eddy currents in the PCB to which the sensor IC 1500 is mounted. Advantageously, the eddy current reduction features discussed herein can reduce or even eliminate such eddy currents, thereby improving sensing accuracy and response time.

While differential sensing may be implemented, for example using two sensing elements 1510a, 1510b as shown, in some embodiments, the current sensor 1500 can include only a single sensing element. Furthermore, it will also be appreciated that differential sensing can be implemented using more than two sensing elements and can include the use of sensing elements arranged in a bridge configuration.

The current sensor 1500 may be configured to output a signal VOUT that is proportional to $\Delta B = B_R - B_L$ where $B_R$ represents magnetic field incident on one of the magnetic field sensing elements 1510a, 1510b and $B_L$ represents magnetic field incident on the other one of the magnetic field sensing elements 1510a, 1510b. The sensor output VOUT is also affected by the sensitivity, α, of the signal path and can be represented as follows:

$$VOUT = \alpha \times \Delta B \quad (1)$$

The relationship between the primary current to be measured and the differential field $\Delta B$ can be represented by a coupling coefficient or factor, cf as follows:

$$\Delta B = cf \times I \quad (2)$$

It will be appreciated that coupling coefficient cf corresponds to coupling (e.g., transfer of energy, etc.) in a given current sensor system and varies with frequency.

Example current sensor 1500 includes a VCC (supply voltage) pin 1501, a VOUT (output signal) pin 1502, and a GND (ground) pin 1503. The VCC pin 1501 is used for the input power supply or supply voltage for the current sensor 1500. A bypass capacitor, $C_{BYPASS}$, can be coupled between the VCC pin 1501 and ground. The VCC pin 1501 can also be used for programming the current sensor 1500. The VOUT pin 1502 is used for providing the output signal of the current sensor 1500 to circuits and systems (not shown) and can also be used for programming. An output load capacitance $C_L$ is coupled between the VOUT pin 1502 and ground. The example current sensor 1500 can include a first diode D1 coupled between the VCC pin 1501 and chassis ground and a second diode D2 coupled between the VOUT pin 1502 and chassis ground.

Magnetic field signals generated by the magnetic field sensing elements 1510a, 1510b are coupled to a dynamic offset cancellation circuit 1512, which is further coupled to an amplifier 1514. The amplifier 1514 is configured to generate an amplified signal for coupling to the signal recovery circuit 1516. Dynamic offset cancellation circuit 1512 may take various forms including chopping circuitry and may function in conjunction with offset control 1534 to remove offset that can be associated with the magnetic field sensing elements 1510a, 1510b and/or the amplifier 1514. For example, offset cancellation circuit 1512 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 1500 to regulate the supply voltage.

A programming control circuit 1522 is coupled between the VCC pin 1501 and EEPROM and control logic 1530 to provide appropriate control to the EEPROM and control logic circuit. EEPROM and control logic circuit 1530 determines any application-specific coding and can be erased and reprogrammed using a pulsed voltage. A sensitivity control circuit 1524 can be coupled to the amplifier 1514 to generate and provide a sensitivity control signal to the amplifier 1514 to adjust a sensitivity and/or operating voltage of the amplifier. An active temperature compensation circuit 1532 can be coupled to sensitivity control circuit 1524, EEPROM and control logic circuit 1530, and offset control circuit 1534. The offset control circuit 1534 can generate and provide an offset signal to a push/pull driver circuit 1518 (which may be an amplifier) to adjust the sensitivity and/or operating voltage of the driver circuit. The active temperature compensation circuit 1532 can acquire temperature data from EEPROM and control logic circuit 830 via a temperature sensor 1515 and perform necessary calculations to compensate for changes in temperature, if needed. Output clamps circuit 1536 can be coupled between the EEPROM and control logic 1530 and the driver 1518 to limit the output voltage and for diagnostic purposes. For example, if the total output range can be from 0V to 5V, for magnetic fields from 0 G to 1000 G, it may be desired to use a clamp at 0.5V for any field below 100 G. For example, it may be known that below 100 G, the sensor 1500 does not generate a trustable signal. Hence, if the IC output is 0.5V, it is evident that the measurement is not valid and cannot be trusted. Or clamps at 1V and 4V could be used and the 0-1V and 4-5V ranges can be used for communicating diagnostic information (e.g., 4.5V on the output could indicate "Hall plate is dead" and 0.5V could indicate "Undervoltage VCC detected", etc.). An undervoltage detection circuit 1526 can operate to detect an undervoltage condition of the supply voltage level VCC.

It will be appreciated that while FIG. 15 shows an example current sensor IC 1500 primarily as a digital implementation, any appropriate current sensor can be used in accordance with the present disclosure, including both digital, analog, and combined digital and analog implementations.

Diagnostic circuitry can be provided such as a broken ground detection circuit 1506, a temperature fault comparator 1540, an overcurrent fault comparator 1544, and a fault controller 1548. A fault signal driver 1550 can include a switch and a protection diode D3 can be provided at a fault output pin 1507 of the IC 10. A communication connection 1509 can be coupled to the EEPROM and control logic 1530 and to a protection diode D4 and can provide a mechanism for communication between the sensor IC 1500 and external circuits and systems, such as for parameter selection and programming purposes.

Accordingly, it is submitted that the scope of the patent should not be limited to the described embodiments but rather should be limited only by the spirit and scope of the following claims.

What is claimed is:

1. A current sensor system:
  a current sensor integrated circuit comprising:
    a lead frame comprising a die attach pad and at least one lead;
    a semiconductor die having a first surface attached to the die attach pad and a second, opposing surface;
    at least one magnetic field sensing element supported by the semiconductor die and configured to sense a current in a proximate primary conductor; and
    a non-conductive mold material enclosing the semiconductor die and a portion of the at least one lead; and
  a printed circuit board on which the current sensor is mounted, the printed circuit board having a ground plane, wherein the ground plane has a feature configured to reduce an eddy current resulting from a magnetic field generated by the current in the proximate primary conductor.

2. The current sensor system of claim 1, wherein the ground plane feature is substantially vertically aligned with the at least one magnetic field sensing element.

3. The current sensor system of claim 1, wherein the ground plane feature comprises a hole in the ground plane.

4. The current sensor system of claim 3, wherein the hole has a dimension larger than a dimension of the non-conductive mold material.

5. The current sensor system of claim 4, wherein the current sensor integrated circuit is mounted in the hole.

6. The current sensor system of claim 3, wherein at least a portion of the hole is positioned under the current sensor integrated circuit.

7. The current sensor system of claim 3, wherein the hole is positioned around and under the current sensor integrated circuit.

8. The current sensor system of claim 1, wherein the ground plane feature comprises a plurality of elongated cuts.

9. The current sensor system of claim 8, wherein each of the plurality of elongated cuts extends in a single direction.

10. The current sensor system of claim 9, wherein the single direction is substantially parallel to the at least one lead.

11. The current sensor system of claim 9, wherein the single direction is diagonal with respect to the at least one lead.

12. The current sensor system of claim 8, wherein the plurality of elongated cuts comprises a first plurality of elongated cuts extending in a first direction and a second plurality of elongated cuts extending in a second direction that is substantially orthogonal with respect to the first direction.

13. The current sensor system of claim 8, wherein each of the plurality of elongated cuts comprises a continuous cut.

14. The current sensor system of claim 13, wherein the plurality of elongated cuts form a portion of the ground plane that is not electrically coupled to ground.

15. The current sensor system of claim 8, wherein at least one of the elongated cuts is discontinuous.

16. The current sensor system of claim 1, wherein the ground plane feature comprises a plurality of substantially x-shaped cuts.

17. The current sensor system of claim 16, wherein the primary conductor comprises at least one notch proximate to the magnetic field sensing element.

18. The current sensor system of claim 16, wherein the at least one magnetic field sensing element comprises at least two magnetic field sensing elements, each configured to generate a respective magnetic field signal indicative of a magnetic field, wherein the semiconductor die further supports a circuit responsive to the magnetic field signals from the at least two magnetic field sensing elements and configured to generate a current sensor output signal comprising a difference between the magnetic field signals from the at least two magnetic field sensing elements and indicative of the current through the primary conductor.

19. The current sensor system of claim 1, wherein the first surface of the semiconductor die supports the at least one magnetic field sensing element.

20. The current sensor system of claim 1, wherein the second surface of the semiconductor die supports the at least one magnetic field sensing element.

21. The current sensor system of claim 1, wherein the at least one lead comprises at least one lead coupled to the ground plane.

22. A method, comprising:
  providing a printed circuit board with a ground plane having a feature, wherein the feature is configured to reduce an eddy current caused by a magnetic field generated by a current in a primary conductor;
  providing a current sensor integrated circuit having a lead frame comprising a die attach pad and at least one lead, a semiconductor die having a first surface attached to the die attach pad and a second, opposing surface, at least one magnetic field sensing element configured to sense the current in the primary conductor when the magnetic field sensing element is placed in proximity of the primary conductor, and a non-conductive mold material enclosing the semiconductor die and a portion of the at least one lead; and
  mounting the current sensor integrated circuit on the printed circuit board.

23. The method of claim 22, wherein providing the printed circuit board comprises providing the feature of the ground plane in substantial vertical alignment with the at least one magnetic field sensing element.

24. The method of claim 22, wherein providing the printed circuit board comprises providing the feature of the ground plane in the form of a hole having a dimension larger than a dimension of the non-conductive mold material.

25. The method of claim 22, wherein providing the printed circuit board comprises providing the feature of the ground plane in the form of a plurality of elongated cuts.

26. The method of claim 22, wherein providing the printed circuit board comprises providing the feature of the ground plane in the form of a plurality of substantially x-shaped cuts.

* * * * *